(12) United States Patent
Cone et al.

(10) Patent No.: US 11,126,079 B1
(45) Date of Patent: Sep. 21, 2021

(54) NANO-FABRICATION SYSTEM WITH CLEANING SYSTEM FOR CLEANING A FACEPLATE OF A DISPENSER AND METHOD OF CLEANING THE FACEPLATE

(71) Applicant: CANON KABUSHIKI KAISHA, Tokyo (JP)

(72) Inventors: Craig William Cone, Austin, TX (US); Roger R. Wenzel, Jarell, TX (US); Jason Battin, Pflugerville, TX (US); Antoine Dellinger, Liberty Hill, TX (US); Hiroyuki Kondo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/844,782

(22) Filed: Apr. 9, 2020

(51) Int. Cl.
| | |
|---|---|
| B41J 2/16 | (2006.01) |
| G03F 7/00 | (2006.01) |
| A47L 9/28 | (2006.01) |
| B05B 15/52 | (2018.01) |
| B41J 2/165 | (2006.01) |
| B05D 3/12 | (2006.01) |

(52) U.S. Cl.
CPC .......... *G03F 7/0002* (2013.01); *A47L 9/2815* (2013.01); *B05B 15/52* (2018.02); *B05D 3/12* (2013.01); *B41J 2/16532* (2013.01); *B41J 2/16579* (2013.01); *B41J 2002/16582* (2013.01)

(58) Field of Classification Search
CPC .... B05B 15/52; B41J 2/16532; B41J 2/16579
See application file for complete search history.

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 9,452,607 B2 | 9/2016 | Kuypers et al. | |
| 2009/0237435 A1 | 9/2009 | Inoue | |
| 2012/0229562 A1* | 9/2012 | Friedmann | B41J 2/16532 347/30 |
| 2020/0361210 A1* | 11/2020 | Sato | B41J 2/16526 |

FOREIGN PATENT DOCUMENTS

JP   2008012880 A   1/2008

* cited by examiner

*Primary Examiner* — Austin Murata
(74) *Attorney, Agent, or Firm* — Canon U.S.A., Inc., IP Division

(57) ABSTRACT

A method of cleaning a dispenser including a faceplate, comprises emitting light over the surface of the faceplate across the width of the faceplate, measuring an intensity of the light at a plurality of points on the surface of the faceplate after the light has passed over the width, determining, based on the measured light intensity, whether an amount of accumulated formable material on the faceplate is greater than a predetermined value, and in a case that the amount of accumulated formable material is greater than a predetermined value, imparting a suction force on the surface of the faceplate using the vacuum at a distance from the faceplate to remove at least a portion of the accumulated formable material from the surface of the faceplate.

20 Claims, 17 Drawing Sheets

NANO-FABRICATION SYSTEM WITH CLEANING SYSTEM FOR CLEANING A FACEPLATE OF A DISPENSER AND METHOD OF CLEANING THE FACEPLATE

BACKGROUND

Field of Art

The present disclosure relates to a nano-fabrication system having a cleaning system for cleaning a faceplate of a dispenser and a method of cleaning the faceplate.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

The nano-fabrication technique involves dispensing the formable material from a dispenser onto the substrate. Over many dispensing cycles, the formable material may begin to accumulate on a faceplate of the dispenser. Eventually, the amount of accumulation can interfere with the production and needs to be cleaned. It desirable for a cleaning system and method that does not require physical contact with the faceplate.

SUMMARY

A method of cleaning a dispenser including a faceplate, the faceplate having a first end, a second end, a surface, a length extending in an X dimension from the first end to the second end, and a width extending in a Y dimension, the method comprising: translating a light emitter along the X dimension across the length of the faceplate, emitting light from the light emitter over the surface of the faceplate along the Y dimension during the translating of the light emitter, measuring an intensity of the light at a plurality of points on the surface of the faceplate along the X dimension after the light has passed over the surface of the faceplate along the Y dimension, determining, based on the measured light intensity, whether an amount of accumulated formable material of at least one point of the plurality of points is greater than a predetermined value, and in a case that the amount of accumulated formable material at the at least one point of the plurality of points is determined to be greater than a predetermined value: translating a vacuum apparatus across the faceplate along the X dimension, the vacuum apparatus being located a distance from the surface of the faceplate, and imparting a suction force on the surface of the faceplate using the vacuum apparatus during the translating of the vacuum apparatus to remove at least a portion of the accumulated formable material from the surface of the faceplate A dispensing system, comprising a dispenser including a faceplate, the faceplate having: a first end, a second end, a surface, a length extending in an X dimension from the first end to the second end, and a width extending in a Y dimension, a vacuum apparatus facing the faceplate and located a distance from the faceplate, a light emitter, a light receiver, a translating mechanism, one or more processors, and one or more memories storing instructions, when executed by the one or more processors, causes the dispensing system to: actuate the translating mechanism to translate the light emitter along the X dimension across the length of the faceplate, actuate the light emitter to emit light over the surface of the faceplate along the Y dimension during the translating of the light emitter, actuate the light receiver to measure an intensity of the light at a plurality of points on the surface of the faceplate along the X dimension after the light has passed over the surface of the faceplate along the Y dimension, determine, based on the measured light intensity, whether an amount of accumulated formable material of at least one point of the plurality of points is greater than a predetermined value, and in a case that the amount of accumulated formable material at the at least one point of the plurality of points is determined to be greater than a predetermined value: actuate the translating mechanism to translate the vacuum apparatus across the faceplate along the X dimension, and impart a suction force on the surface of the faceplate using the vacuum apparatus during the translating of the vacuum apparatus to remove at least a portion of the accumulated formable material from the surface of the faceplate.

A method of making an article, comprising cleaning a dispenser including a faceplate, the faceplate having a first end, a second end, a surface, a length extending in an X dimension from the first end to the second end, and a width extending in a Y dimension, the cleaning including: translating a light emitter along the X dimension across the length of the faceplate, emitting light from the light emitter over the surface of the faceplate along the Y dimension during the translating of the light emitter, measuring an intensity of the light at a plurality of points on the surface of the faceplate along the X dimension after the light has passed over the surface of the faceplate along the Y dimension, determining, based on the measured light intensity, whether an amount of accumulated formable material of at least one point of the plurality of points is greater than a predetermined value, and in a case that the amount of accumulated formable material at the at least one point of the plurality of points is determined to be greater than a predetermined value: translating a vacuum apparatus across the faceplate along the X dimension, the vacuum apparatus being located a distance from the surface of the faceplate, and imparting a suction force on the surface of the faceplate using the vacuum apparatus during the translating of the vacuum apparatus to remove at least a portion of the accumulated formable material from the surface of the faceplate, dispensing a portion of the formable material onto a substrate using the dispenser, forming a pattern or a layer of the dispensed formable material on the substrate, and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
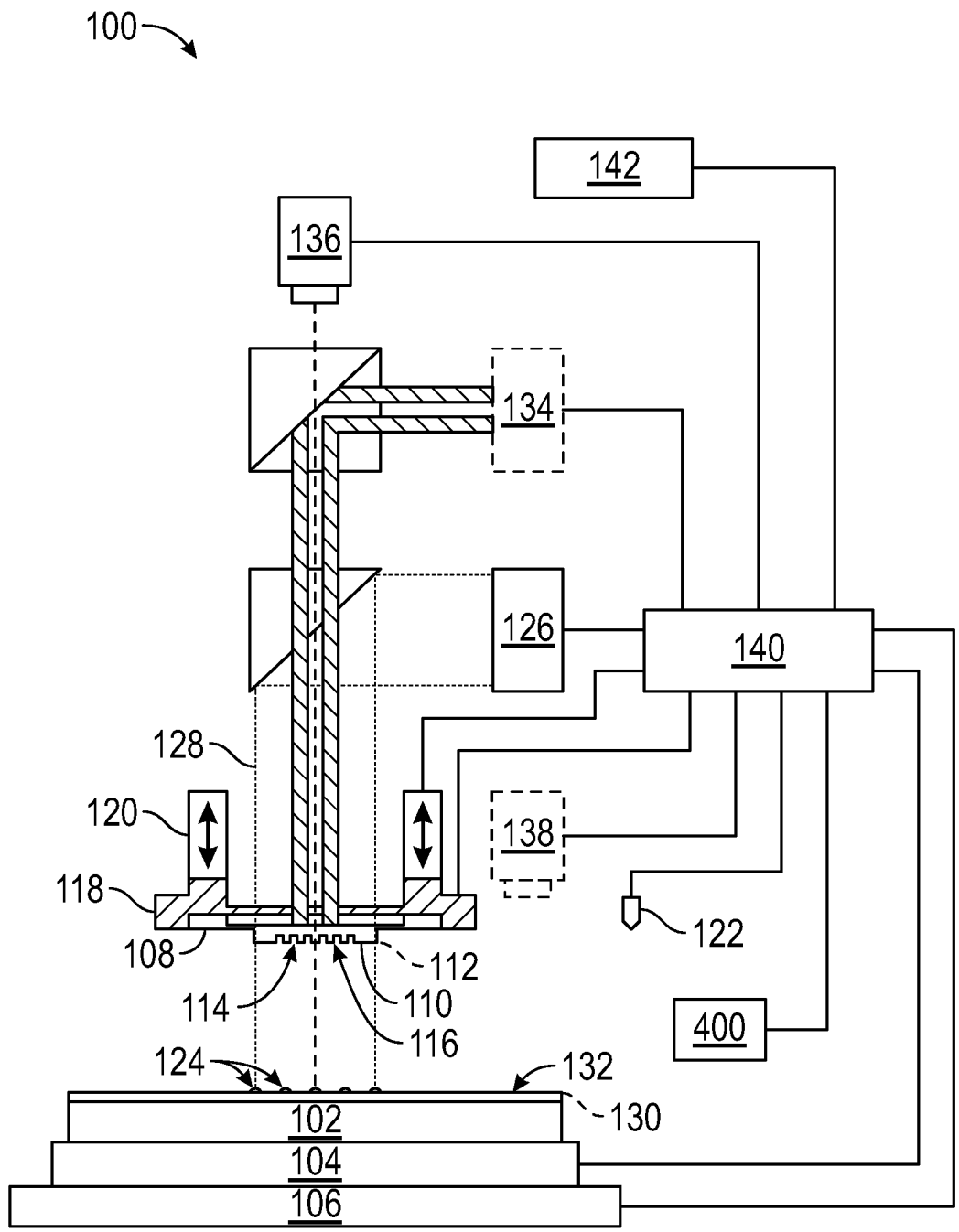
FIG. 1 is an illustration of an exemplary nanoimprint lithography system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

As noted above, the nano-fabrication technique involves dispensing the formable material from a dispenser onto the substrate. Over many dispensing cycles, the formable material may accumulate on a faceplate of the dispenser. Eventually, the amount of accumulation can interfere with the production and needs to be cleaned. It desirable for a cleaning system and method that does not require physical contact with the faceplate.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc, which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
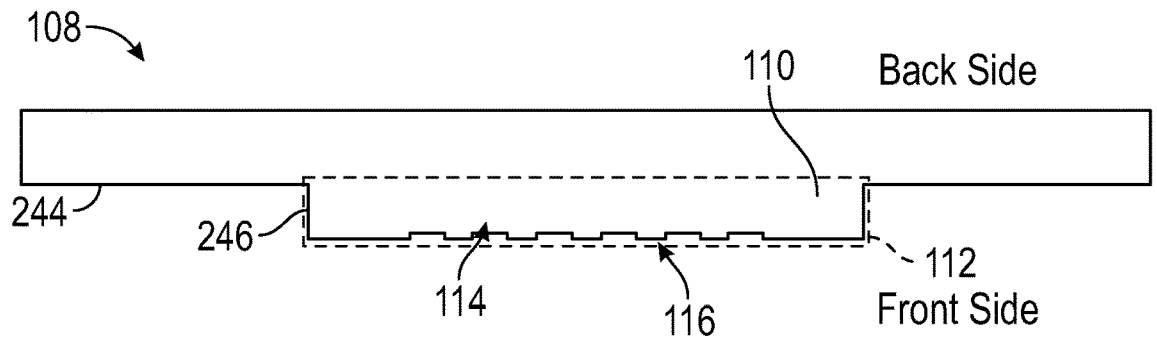
FIG. 2 is an illustration of an exemplary template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative template may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
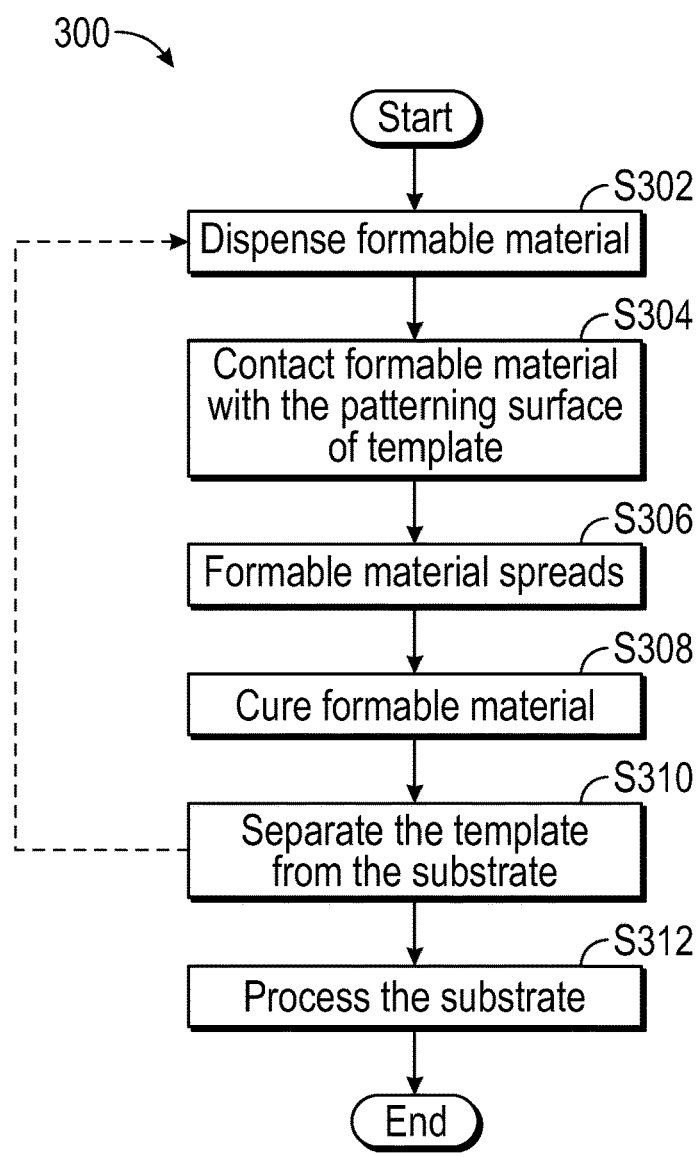
FIG. 3 is a flowchart illustrating an exemplary imprinting method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+ +\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Drop Dispensing Method

A drop dispensing method by the nanoimprint lithography system 100 or planarization system can be used to dispense a pattern of drops of formable material 124 onto the substrate 102, which is then imprinted/planarized. Imprinting/planarizing may be done in a field by field basis or on a whole wafer basis. The drops of formable material 124 may also be deposited in a field by field basis or on a whole substrate basis. Even when the drops are deposited on a whole substrate basis generating the drop pattern is preferably done on a field by field basis.

Generating a drop pattern for a full field may include a processor 140 receiving a substrate pattern of a representative substrate 102, and a template pattern of a representative template 108.

The substrate pattern may include information about substrate topography of the representative substrate, a field of the representative substrate and/or a full field of the representative substrate. The substrate topography may be measured, generated based on previous fabrication steps and/or generated based on design data. In an alternative embodiment, the substrate pattern is featureless either because there were no previous fabrication steps or the substrate had previously been planarized to reduce topography. The substrate topography may include information about the shape of an edge such as a beveled edge or a rounded edge of the representative substrate. The substrate topography may include information about the shape and position of one or more flats or notches which identify the orientation of the substrate. The substrate topography may include information about a shape and position of a reference edge which surrounds the area of the substrate on which patterns are to be formed.

The template pattern may include information about the topography of the patterning surface 112 of the representative template. The topography of the patterning surface 112 may be measured and/or generated based on design data. In an alternative embodiment, the template pattern of the representative embodiment is featureless and may be used to planarize the substrate 102. The patterning surface 112 may be the same size as: an individual full field; multiple fields; the entire substrate, or larger than the substrate.

Once the substrate pattern and the template pattern are received, a processor 140 may calculate a distribution of formable material 124 that will produce a film that fills the volume between the substrate and the patterning surface when the substrate and the patterning surface are separated by a gap during imprinting. The distribution of formable material on the substrate may take the form of: an areal density of formable material; positions of droplets of formable material; and/or volume of droplets of formable material. Calculating the distribution of formable material may take into account one or more of: material properties of the formable material; material properties of the patterning surface; material properties of the substrate surface; spatial variation in volume between the patterning surface and the substrate surface; fluid flow; evaporation; etc.

Cleaning System

Figure 4A:
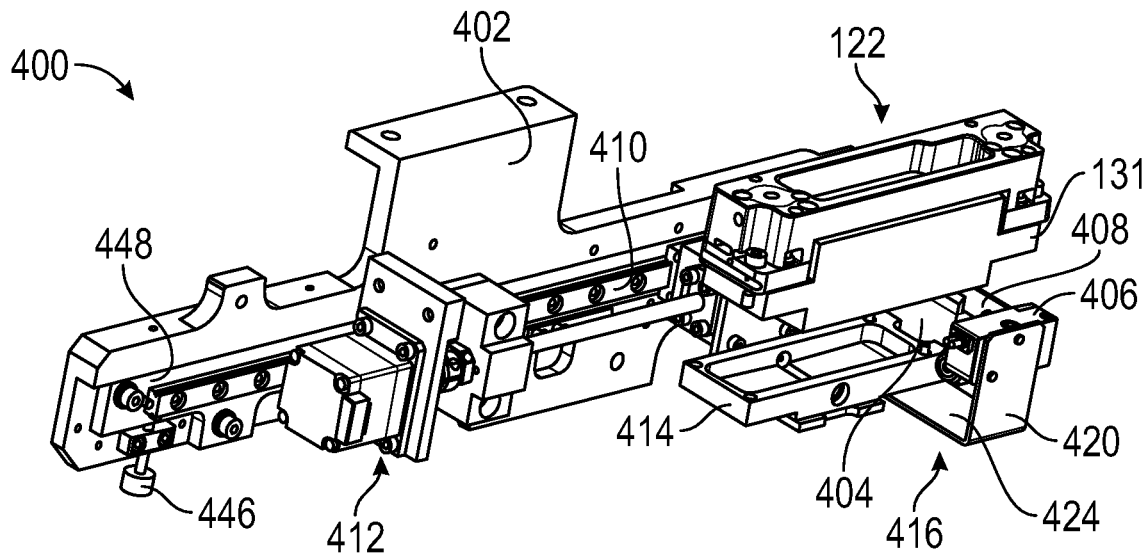
FIG. 4A shows a perspective view of a cleaning system oriented in a first operative position in accordance with an example embodiment.
Figure 4B:
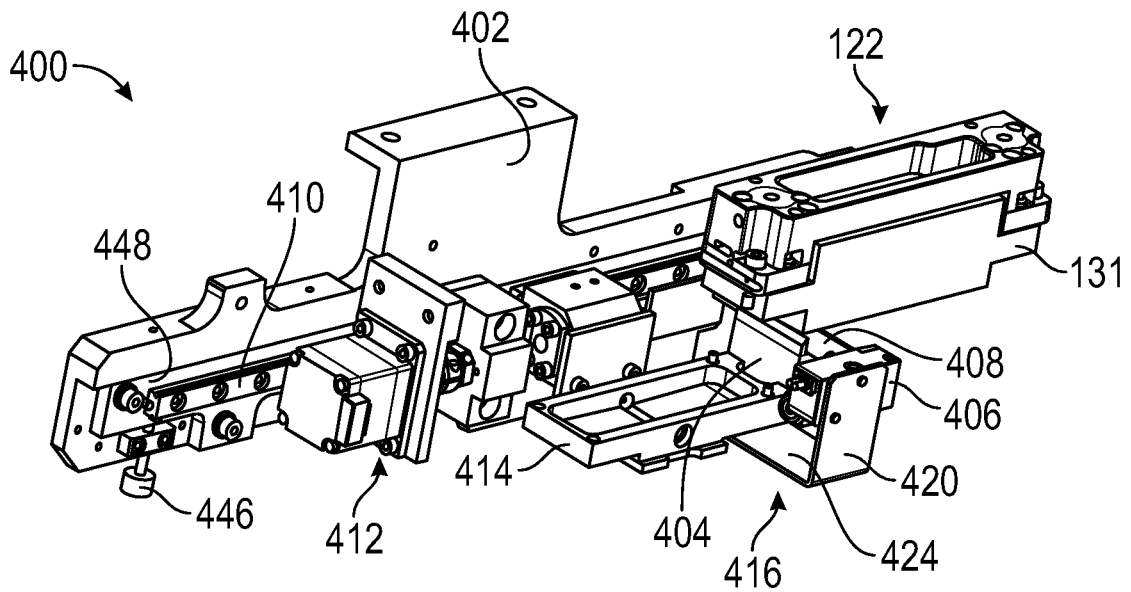
FIG. 4B shows a perspective view of the cleaning system of FIG. 4A oriented in a second operative position in accordance with an example embodiment.
Figure 5A:
FIG. 5A shows a side view of a dispenser in accordance with an example embodiment.
Figure 5B:
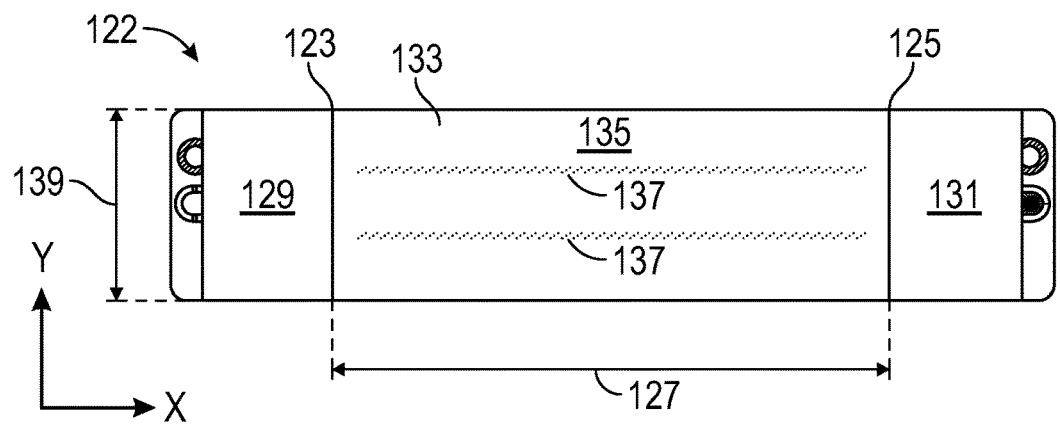
FIG. 5B shows an underside view of the dispenser of FIG. 5A in accordance with an example embodiment.
Figure 5C:
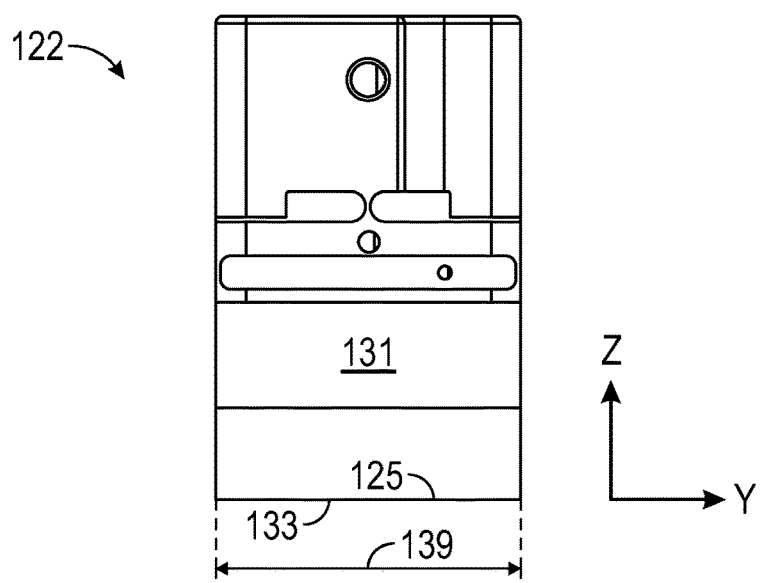
FIG. 5C shows an end view of the dispenser of FIG. 5A in accordance with an example embodiment.

FIGS. 4A and 4B show perspective views of a cleaning system 400 for cleaning formable material from the dispenser 122, all of which are parts of the overall system 100. FIG. 5A shows a side view of the dispenser 122. FIG. 5B shows an underside view of the dispenser 122. FIG. 5C shows an end view of the dispenser 122. The dispenser 122 includes a faceplate 133 having a surface 135 in which a plurality of dispensing nozzles 137 are formed. The number of nozzles 137 formed in the surface 135 of the faceplate 133 may be on the order of hundreds, for example 500 or more. The faceplate 133 includes a first end 123 and a second end 125. The faceplate 133 has a length 127 extending in an X dimension from the first end 123 to the second 125. The dispenser 122 has a first flange 129 extending from the first end 123 and a second flange 131 extending from the second end 125. The faceplate 133 includes a width 139 extending in a Y dimension, the Y dimension being perpendicular to the X dimension.

FIG. 4A shows a perspective view the cleaning system 400 oriented in a first operative position and FIG. 4B shows the cleaning system 400 oriented in a second operative position. The cleaning system 400 may include a bracket 402 that serves as a fixed stationary structure to which the other elements described herein are mounted. The bracket 402 itself may be mounted within a housing of the overall system 100. The cleaning system 400 may include a vacuum apparatus 404 coupled with a vacuum source 405 (FIG. 8), a light emitter/sensor 406 that emits and measures intensity of light 408, a guide rail 410, and a translating mechanism 412 that translates the vacuum apparatus 404 and light emitter/sensor 406 along the guide rail 410. The light emitter/sensor 406 may include a light emitter that emits light and a corresponding light sensor that measures an intensity of the light. Such light emitter/sensors are known in the art, for example a Keyence LV-S62 retro-reflective type beam sensor or a Panasonic HG-T1010 thru-beam type digital displacement sensor or any other type of light emitter/sensor may be used. The wavelength(s) of the emitted light should be selected such that it does not significantly alter the formable material being dispensed by the dispenser. That is, as noted above, the formable material may be a photocurable composition where certain light wavelengths will cure the formable material or otherwise causes a change to the formable material. Because the light emitted by the light emitter/sensor 406 is for analytical purposes only, the light wavelength should be selected to have no impact on the formable material, the light wavelength is used for measurement and observation.

As further shown in FIGS. 4A and 4B, the vacuum apparatus 404 and the light emitter/sensor 406 may be coupled with the translating mechanism 412 via a tray 414 and a sensor bracket 416. In the example embodiment shown in FIGS. 4A and 4B, the vacuum apparatus 404 is mounted on the tray 414, while the tray 414 is mounted to the translating mechanism 412. Furthermore, in the example embodiment shown in FIGS. 4A and 4B, the light emitter/sensor 406 is mounted to the tray 414 via the sensor bracket 416.

Figure 6A:
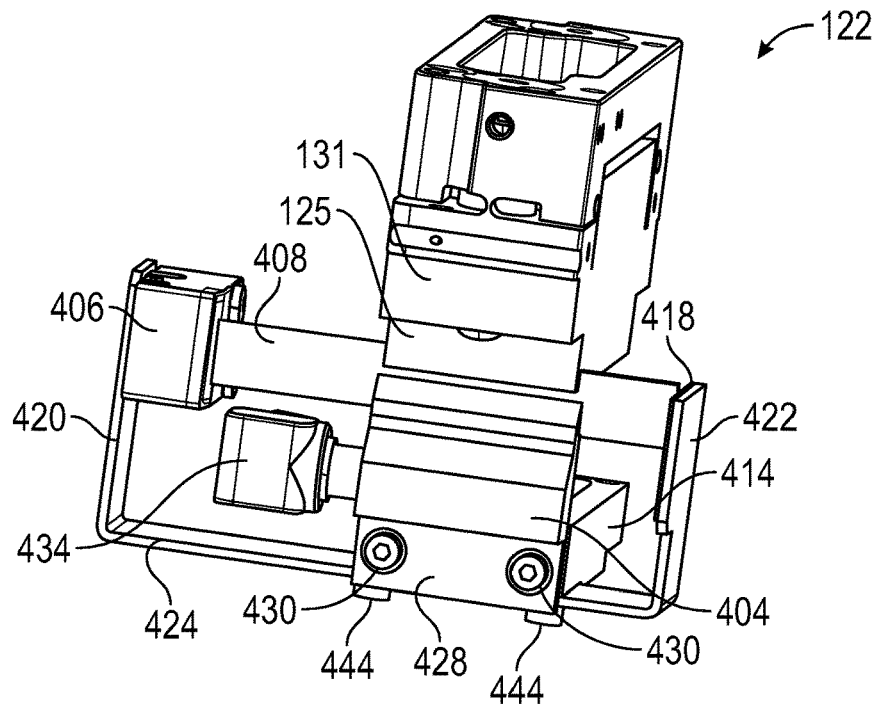
FIG. 6A shows a perspective view of a portion of the cleaning system of FIGS. 4A and 4B in accordance with an example embodiment.
Figure 6B:
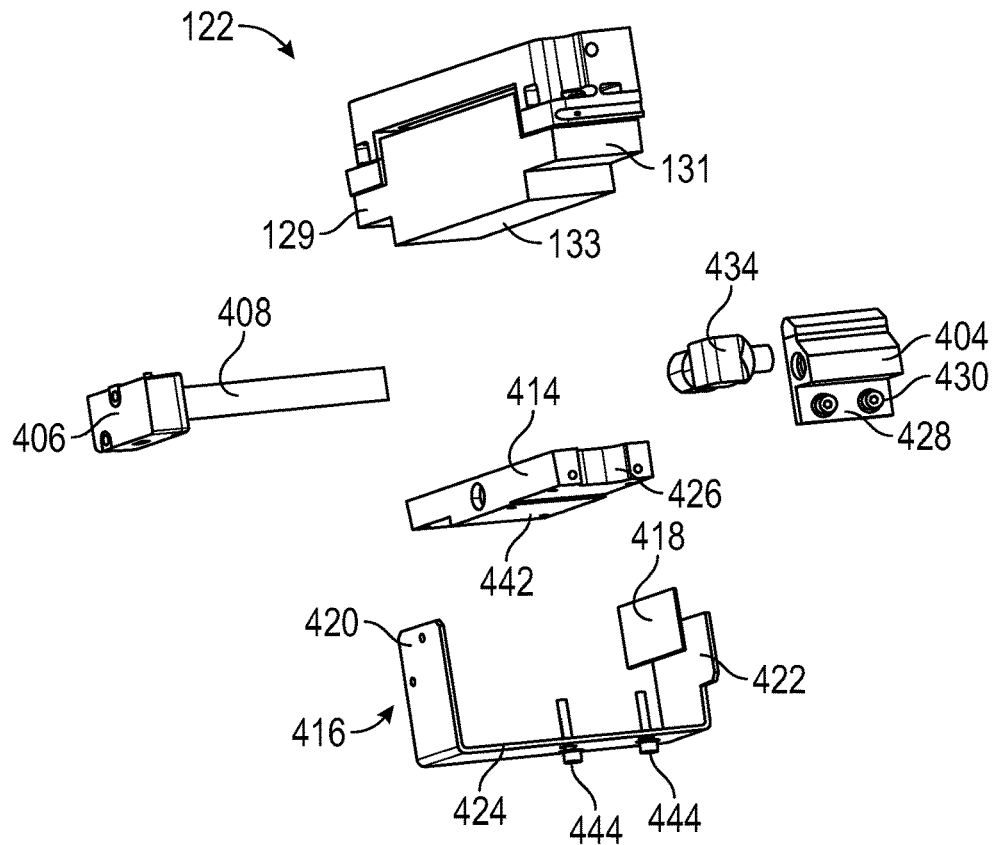
FIG. 6B shows an exploded view of the portion of FIG. 6A in accordance with an example embodiment.
Figure 7:
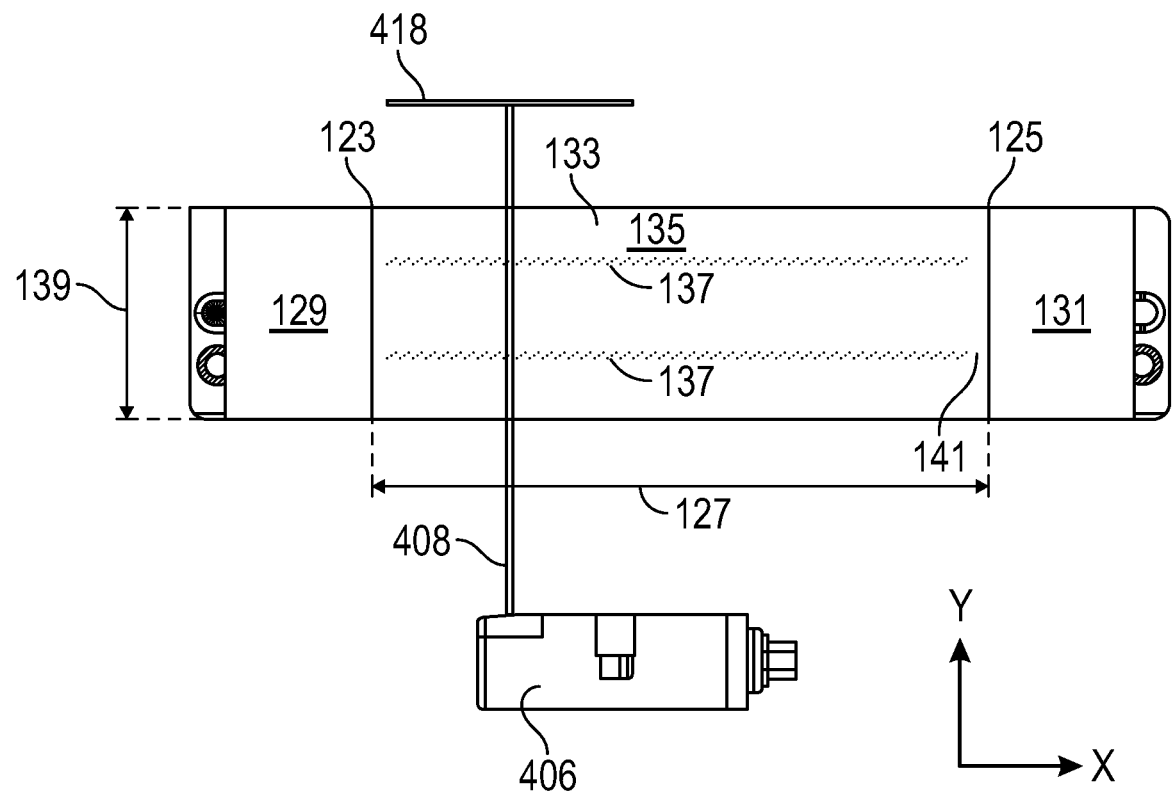
FIG. 7 shows an underside view of the dispenser of FIGS. 5A to 5C with portions omitted in accordance with an example embodiment.

FIG. 6A shows a perspective view of a portion of the cleaning system of FIGS. 4A and 4B. FIG. 6B shows an exploded view of the portion of FIG. 6A. FIG. 7 shows an underside view of the dispenser 122 with only the light emitter/sensor 406 and the light 408 shown. As seen in FIGS. 6A and 6B, the cleaning system 400 may further include a retroreflector 418 attached to the sensor bracket 416. The retroreflector may be made from a material that reflects light back to the light source with minimum scattering. Any suitable retroreflector known in the art may be used. In the embodiment shown in FIGS. 6A and 6B the retroreflector is a thin reflective material. The sensor bracket 416 may have U shape with a first arm 420, a second arm 422 opposing the first arm 420, and a third arm 424 extending from the first arm 420 to the second arm 422. The third arm 424 extends in the Y dimension. The first arm 420 and the second arm 422 extend in the Z dimension perpendicular to the Y dimension. The light emitter/sensor 406 may be mounted to an inner surface of the first arm 420 and the retroreflector 418 may be mounted to an inner surface of the second arm 422, such that the retroreflector 418 is directly opposite the light emitter of the light emitter/sensor 406. The third arm 424 of the sensor bracket 416 may be mounted to an underside surface of the tray 414. Thus, because of this structural arrangement, as best seen in FIG. 7, the light emitter of the light emitter/sensor 406 emits light 408 across the width 139 of the faceplate 133 in the Y dimension where the light is reflected by the retroreflector 418. In another example embodiment, rather than reflecting the light via the retroreflector 418, a light sensor may be mounted to the inner surface of the second arm 422 where the retroreflector 418 is shown in FIG. 6A.

As best seen in FIGS. 6A and 6B, the vacuum apparatus 404 may also be mounted to an end 426 of the tray 414. In particular, the vacuum apparatus 404 may include a mounting portion 428 which may abut an end 426 of the tray 414. The vacuum apparatus 404 may be mounted to the end 426 of the tray 414 by securing the mounting portion 428 to the end 426 of the tray 414 using a securing mechanism 430. The securing mechanism 430 may be a set of screws, for example. The angle of the vacuum apparatus 404 relative to the surface 135 of the faceplate 133 can be set by tightening the securing mechanism 430, which is described in more detail below. For this reason, the securing mechanism 430 is also referred herein as the vacuum apparatus angle adjusting mechanism.

Figure 8:
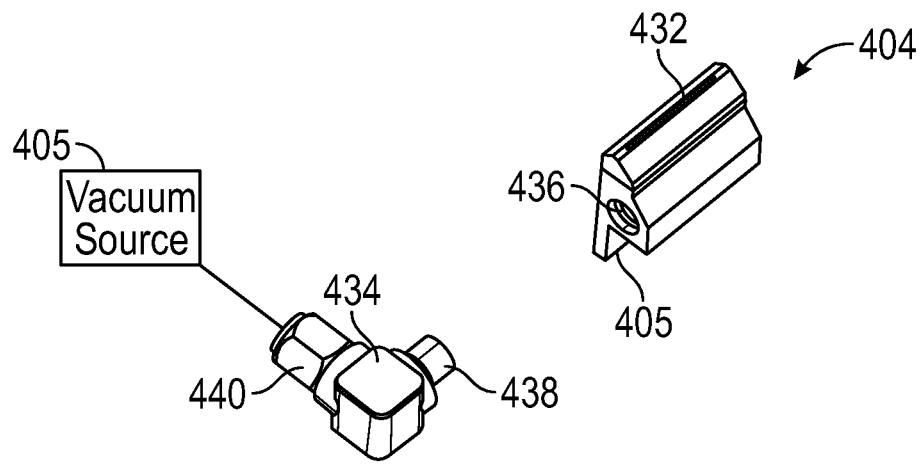
FIG. 8 shows a perspective exploded view of a vacuum apparatus in accordance with an example embodiment.

FIG. 8 shows a perspective exploded view of the vacuum apparatus 404. As best seen in FIG. 8, the vacuum apparatus 404 includes a vacuum orifice 432. The vacuum orifice 432 may be an elongated slit shape where the length of the vacuum orifice 432 is much longer than the width of the vacuum orifice 432. For example, the ratio of the length of the vacuum orifice 432 to the width of the vacuum office 432 may be from 5:1 to 100:1, may be 10:1 to 90:1, may be 20:1 to 80:1, may be 30:1 to 70:1, or may be 40:1 to 65:1. In one example, the ratio may be 60:1. In an example embodiment, the length of the vacuum orifice 432 is substantially the same (e.g., within ±20%) as the width 139 of the faceplate 133 in the Y dimension. In an example embodiment, the width of the vacuum orifice 432 is wide enough so that it does not become clogged with formable material while being narrow enough to supply sufficient vacuum (for example, 0.5 mm, 1 mm, etc.). The vacuum orifice 432 may also have lips on each side which are similar (e.g., within ±30%) in width to the width of the vacuum orifice 432 which helps constrain the suction force to a local region of the faceplate. The vacuum apparatus 404 may further include a vacuum connector 434 and a connector port 436. The vacuum connector 434 may include a first end 438 that connects with the connector port 436 and a second end 440 that connects with the vacuum source 405. Thus, by activating the vacuum source 405, a suction force is applied to the vacuum orifice 432.

As seen in FIG. 6A, once the vacuum apparatus 404 is mounted to the tray 414, the vacuum orifice 432 extends along the width 139 in the Y dimension in the same manner as the light 408. Furthermore, as seen in FIGS. 4A, 4B, and 6A, the sensor bracket 416, and more particularly the third arm 424, is mounted on the underside 442 of the tray 414 via securing mechanism 444. The mounting position of the sensor bracket 416 may be particularly selected such that the light 408 emitted by the light emitter/sensor 406 travels precisely across the surface 135 of the faceplate 133 above the nozzle orifice 432. That is, due to the mounting positions of both the vacuum apparatus 404 and light emitter/sensor 406, the emitted light 408 and the nozzle orifice 432 are coplanar in a Y-Z plane.

Because the tray 414 is coupled with the translating mechanism 412, when the translating mechanism 412 actuates, the tray 414 travels along the guide rail 410 in the X dimension. Likewise, because the vacuum apparatus 404 and the light emitter/sensor 406 are mounted to the tray 414, the translation of the tray 414, in turn, translates the vacuum apparatus 404 and the light emitter/sensor 406 along the guide rail 410 in the X dimension. Thus, it can be said that the translating mechanism 412 translates the vacuum apparatus 404 and the light emitter/sensor 406 in the X dimension. The translating mechanism 412 may be any mechanism known in the art that suitable for imparting linear translation on an object. For example, the translating mechanism may be a linear actuator that may include: a stepper motor; a linear motor; a moving coil; a hydraulic actuator; pneumatic actuator; and the like. The linear actuator may include a position encoder. The position encoder may be a rotary or linear encoder. Such encoders are known in the art and provide position information at a particular moment in time. That is, the position of the light emitter/sensor 406 and the vacuum apparatus 404 in the X dimension can be known based on the information provided by the position encoder, when properly calibrated.

The translation of the vacuum apparatus 404 and the light emitter/sensor 406 is best seen by comparing FIG. 4A and FIG. 4B. In FIG. 4A the vacuum apparatus 404 and the light emitter/sensor 406 have been translated fully across the faceplate 135 in the X dimension such that the light 408 extends across the width 139 in Y dimension at the second end 125 of the faceplate 133. In FIG. 4B the vacuum apparatus 404 and the light emitter/sensor 406 have been fully retracted along the faceplate 133 in the X dimension such that the light 408 extends across the width 139 in Y dimension at the first end 125 of the faceplate 133. In this manner, the light 408 can be emitted and measured at a plurality of points along the X dimension of faceplate 133 by measuring the light as the light/emitter sensor 406 travels along the X dimension. Similarly, a vacuum force can be selectively imparted on the faceplate 133 by actuating the vacuum source 405 when the vacuum orifice 432 of the vacuum apparatus 404 travels along the X dimension. The particular position of the light emitter/sensor 406 in the X dimension can be determined using the rotary or linear encoder noted above.

Figure 9A:
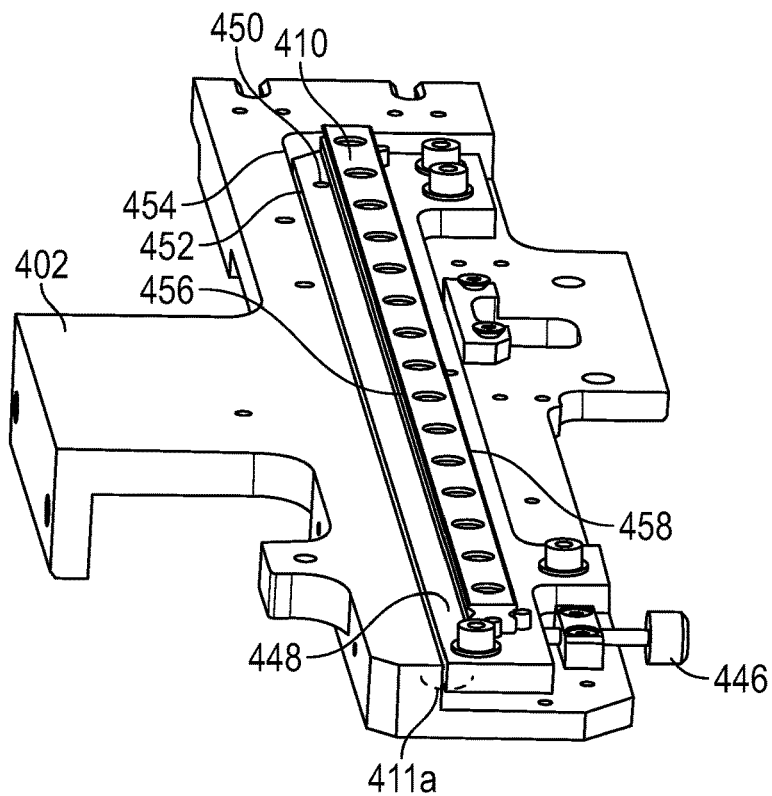
FIG. 9A shows a perspective end view of a portion of the cleaning system in a first orientation, with omissions, in accordance with an example embodiment.
Figure 9B:
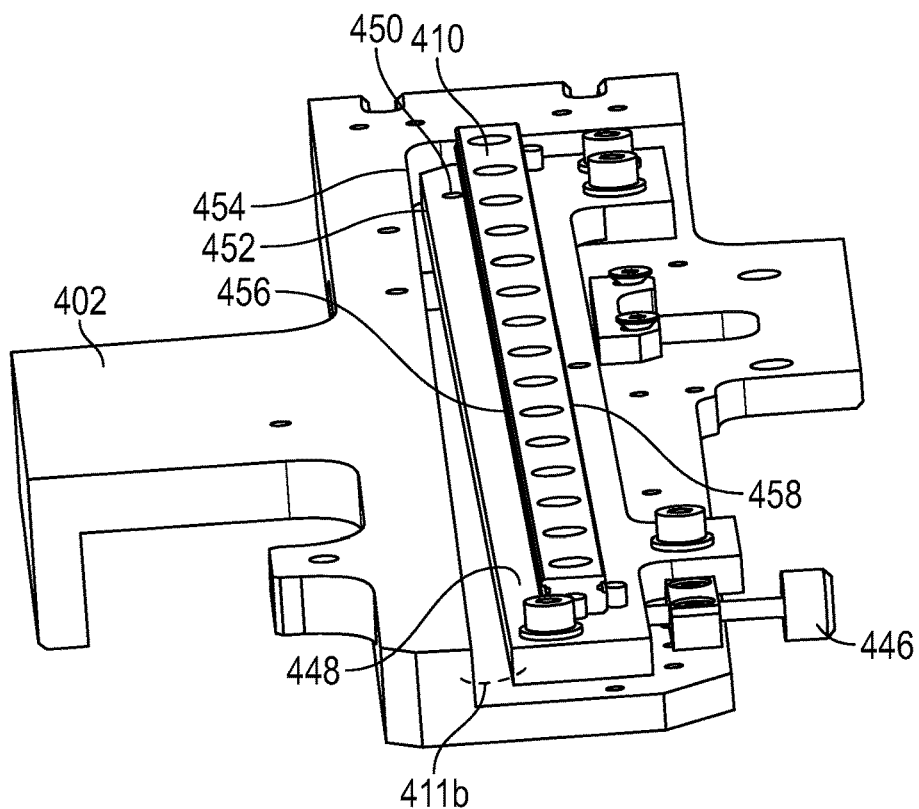
FIG. 9B shows a perspective end view of the portion of the cleaning system of FIG. 9A, in a second orientation, with omissions, in accordance with an example embodiment.

FIGS. 9A and 9B show perspective end views of a portion of the cleaning system 400, with other structure omitted. In particular, FIGS. 9A and 9B show the bracket 402 and guide rail 410 and related structure, while omitting the structure relating to the translation mechanism 412 and all of the elements coupled with the translation mechanism 412. These elements are omitted from FIGS. 9A and 9B so that a change in an angle 411a, 411b of the guide rail 410 is visible. FIG. 9A shows a first orientation of the guide rail 410. FIG. 9B shows a second orientation of the guide rail 410.

As seen in FIGS. 4A, 4B, 9A and 9B, the cleaning system 400 may include a guide rail angle adjustment mechanism 446. The guide rail angle adjustment mechanism 446 is configured to adjust the angle of the guide rail 410 when actuated. For example, the guide rail angle adjustment mechanism 446 may comprise a screw, pin, or the like that when moved forward impinges upon a carrier 448 on which the guide rail 410 is mounted. As seen in FIGS. 9A and 9B, the guide rail angle adjustment mechanism 446 impinges upon the carrier 448 near an end. The carrier further has a pivot point 450 near the center. Thus, when a force is placed upon the end of the carrier 448, the carrier will rotate about the pivot point 450. The pivot point 450 is aligned with a center point of the face plate.

FIG. 9A shows an orientation in which the guide rail angle adjustment mechanism 446 is at a fully engaged position. In this position, the guide rail angle adjustment mechanism 446 has been pushed to the point that an upper long edge 452 of the carrier 448 is nearly parallel to a lower long edge 454 of the bracket 402. That is, in the orientation shown in FIG. 9A, the upper long edge 452 of the carrier 448 has a zero or substantially zero angle 411a relative to the lower long edge 454 of the bracket. Because the guide rail 410 is mounted on the carrier 448, the same can be said of the upper long edge 456 and the lower long edge 458 of the guide rail 410. That is, the upper long edge 456 and the lower long edge 458 of the guide rail 410 are each nearly parallel to the lower long edge 454 of the bracket 402 such that there is a zero or substantially zero angle 411a relative to the lower long edge 454 of the bracket 402.

FIG. 9B shows an orientation in which the guide rail angle adjustment mechanism 446 is at a fully retreated position. In this position, the guide rail angle adjustment mechanism 446 has been pulled to the point that the upper long edge 452 of the carrier 448 has an angle 411b relative to the lower long edge 454 of the bracket 402. That is, in the orientation shown in FIG. 9B, the upper long edge 452 of the carrier 448 has a greater than zero angle 411b relative to the lower long edge 454 of the bracket. For example, the range of the angle 411b may be ±2 degrees depending on the position of the guide rail angle adjustment mechanism. Because the guide rail 410 is mounted on the carrier 448, the same can be said of the upper long edge 456 and the lower long edge 458 of the guide rail 410. That is, the upper long edge 456 and the lower long edge 458 of the guide rail 410 are each at a greater than zero angle relative to the lower long edge 454 of the bracket 402. In this manner, the angle 411a, 411b of the guide rail 410 can be adjusted by actuating the guide rail angle adjustment mechanism 446.

Figure 10A:
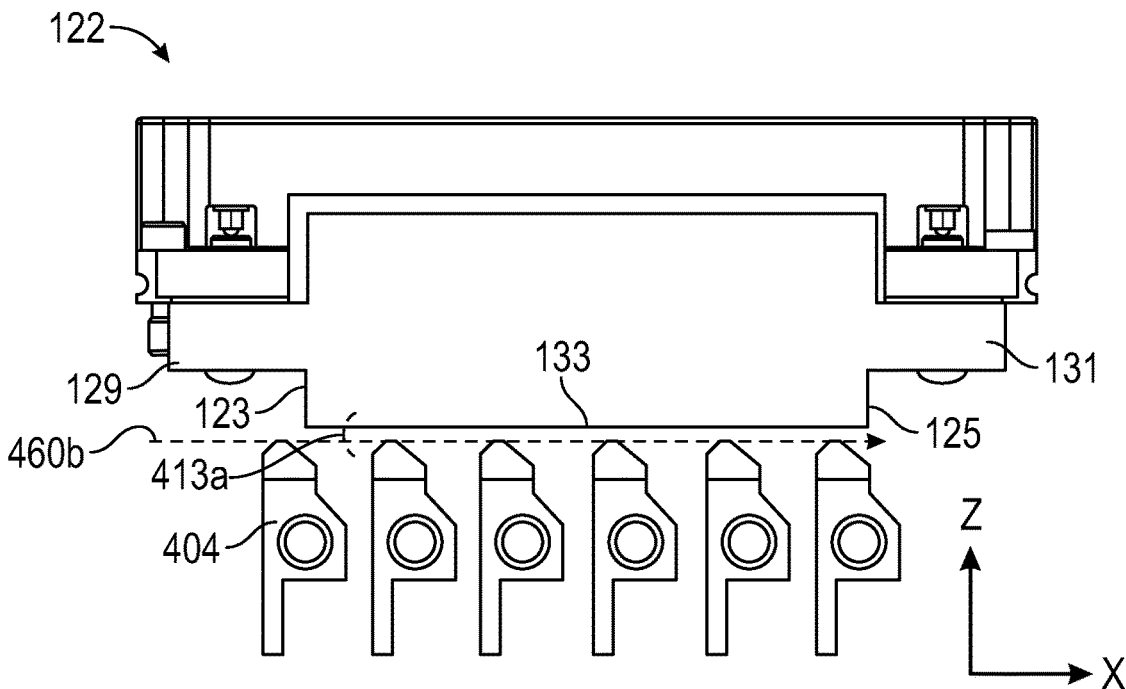
FIG. 10A shows a schematic representation of the impact of a first guide rail angle on a position of the vacuum apparatus relative to a faceplate of the dispenser, in accordance with an example embodiment.
Figure 10B:
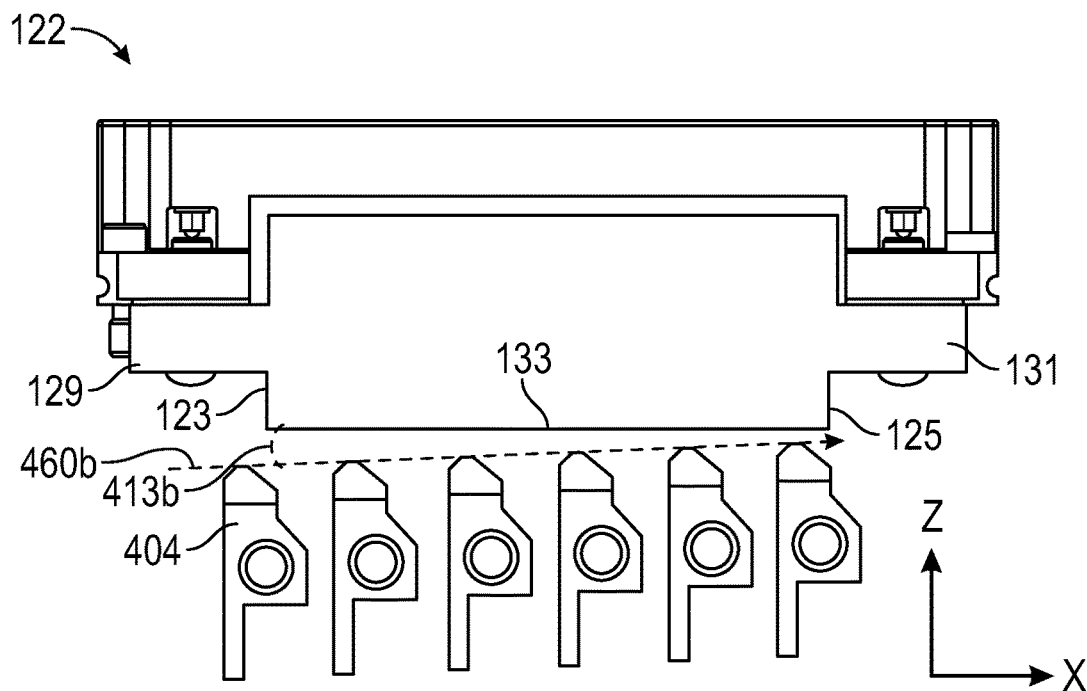
FIG. 10B shows a schematic representation of the impact of a second guide rail angle on a position of the vacuum apparatus relative to a faceplate of the dispenser, in accordance with an example embodiment.

FIGS. 10A and 10B show a schematic representations of the impact of the guide rail angle 411a, 411b on the position of the vacuum apparatus 404 relative to the surface 135 of the faceplate 133. Because the vacuum apparatus 404 travels along the guide rail 410 via the tray 414, the vacuum apparatus 404 and the tray 414 will have a direction of travel 460a, 460b at an angle 413a, 413b relative to the horizontal plane defined by the surface 135 of the faceplate 133, depending on the guide rail angle 411a, 411b. FIG. 10A shows an orientation that corresponds to the guide rail angle 411a while FIG. 10B shows an orientation that corresponds to the guide rail angle 411b. As seen in FIG. 10A, when the guide rail angle 411a is zero or substantially zero, as the vacuum apparatus 404 travels in the direction of travel 460a underneath the faceplate 133, the angle 413a is also zero or substantially zero. That is, in this case, a distance in the Z dimension between the faceplate 133 and the orifice 432 of the vacuum apparatus 404 is nearly constant, and there is zero or near zero displacement long the Z dimension. Rather, the displacement is nearly entirely in the X dimension. If the angle 413a, 413b were precisely zero, there would be no displacement in Z dimension and only displacement in X dimension as the vacuum apparatus 404 travels across the faceplate 133. As seen in FIG. 10B, when the guide rail angle 411b is greater than zero (and greater than angle 411a), as the vacuum apparatus 404 travels in travel direction 460b underneath the faceplate 133, the angle 413b is also greater than zero (and greater than 413a). That is, in this case, a distance in the Z dimension between the faceplate 133 and the orifice 432 of the vacuum apparatus 404 is much larger at the first end 123 than at the second end 125, and there is greater displacement along the Z dimension than in FIG. 10A. While the displacement is still primarily in the X dimension when the vacuum apparatus travels in the direction of travel 460b, there is greater displacement in the Z direction than in FIG. 10A. Therefore, controlling the guide rail angle 411a, 411b in turn controls the angle 413a, 413b relative to the horizontal plane defined by the surface 135 of the faceplate 133.

Figure 11A:
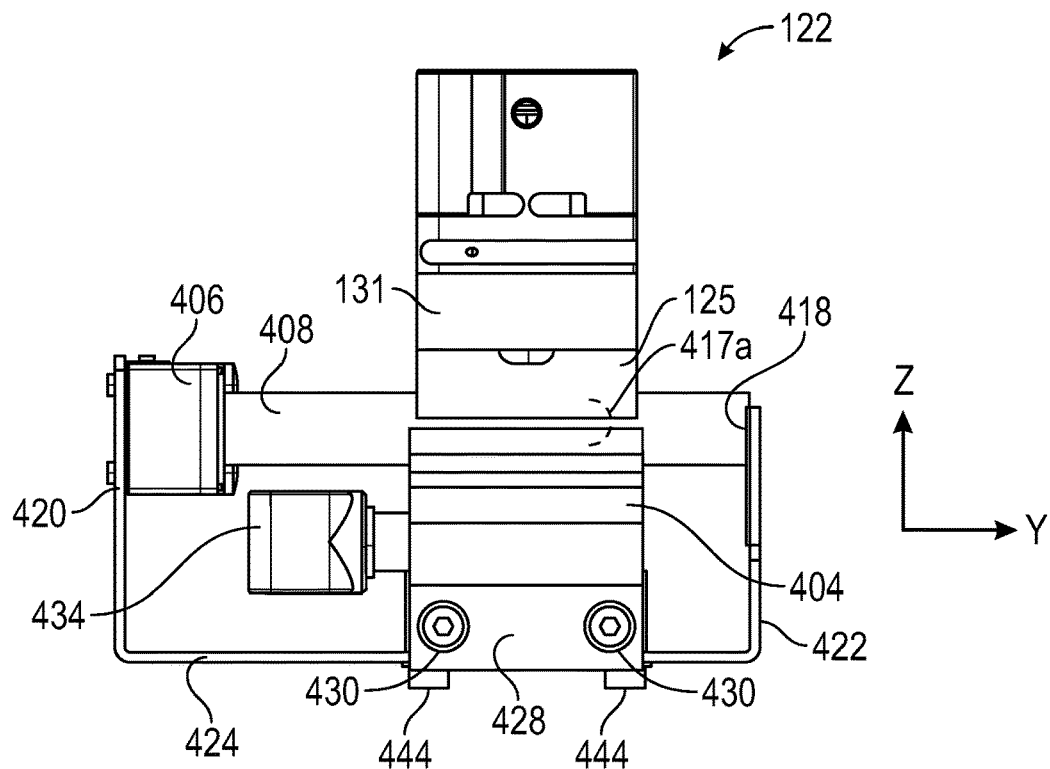
FIG. 11A shows end view of the cleaning system in a first orientation, with omissions, in accordance with an example embodiment.
Figure 11B:
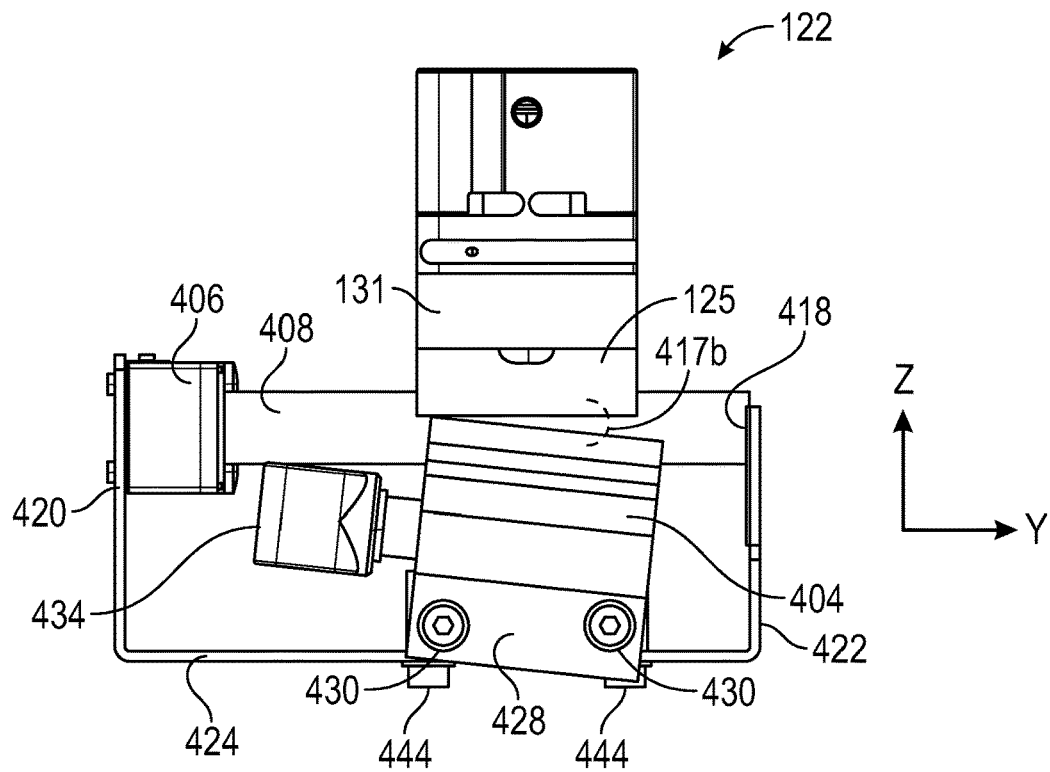
FIG. 11B shows end view of the cleaning system in a second orientation, with omissions, in accordance with an example embodiment.

FIGS. 11A and 11B show end views of the cleaning system 400 with the bracket 402, guide rail 410, translating mechanism 412, and corresponding structure omitted for clarity. As noted above, the angle of the vacuum apparatus 404 relative to the faceplate 133 may be adjusted by tightening the securing mechanism 430. FIG. 11A shows an orientation where the angle 417a of the vacuum apparatus 404 relative to the faceplate 133 is zero or substantially zero. That is, in the orientation shown in FIG. 11A, the faceplate 133 is substantially parallel to the orifice 431 of the vacuum apparatus along the width 139. FIG. 11B shows an orientation where the angle 417b of the vacuum apparatus 404 relative to the faceplate 133 is greater than zero. The particular angle of the vacuum apparatus 404 may be set by first loosening the securing mechanism 430. Once the securing mechanism 430 is loosened, the vacuum apparatus 404 may be rotated about the securing mechanism 430. Once the new angle has been selected, the securing mechanism 430 may be tightened until the mounting portion 428 is tightly held against the tray 412. These steps can be repeated to readjust the angle of the vacuum apparatus 404. The angle of the vacuum apparatus 404 can be adjusted in this manner by ±15 degrees or less, by ±10 degrees or less, by ±5 degrees or less, or by ±1 degrees or less. While FIG. 11B shows a clockwise rotation of the vacuum apparatus 404 from the illustrated viewpoint relative to the orientation in FIG. 11A, the vacuum apparatus 404 may also be rotated in a counterclockwise manner relative to the orientation shown in FIG. 11A.

Figure 12:
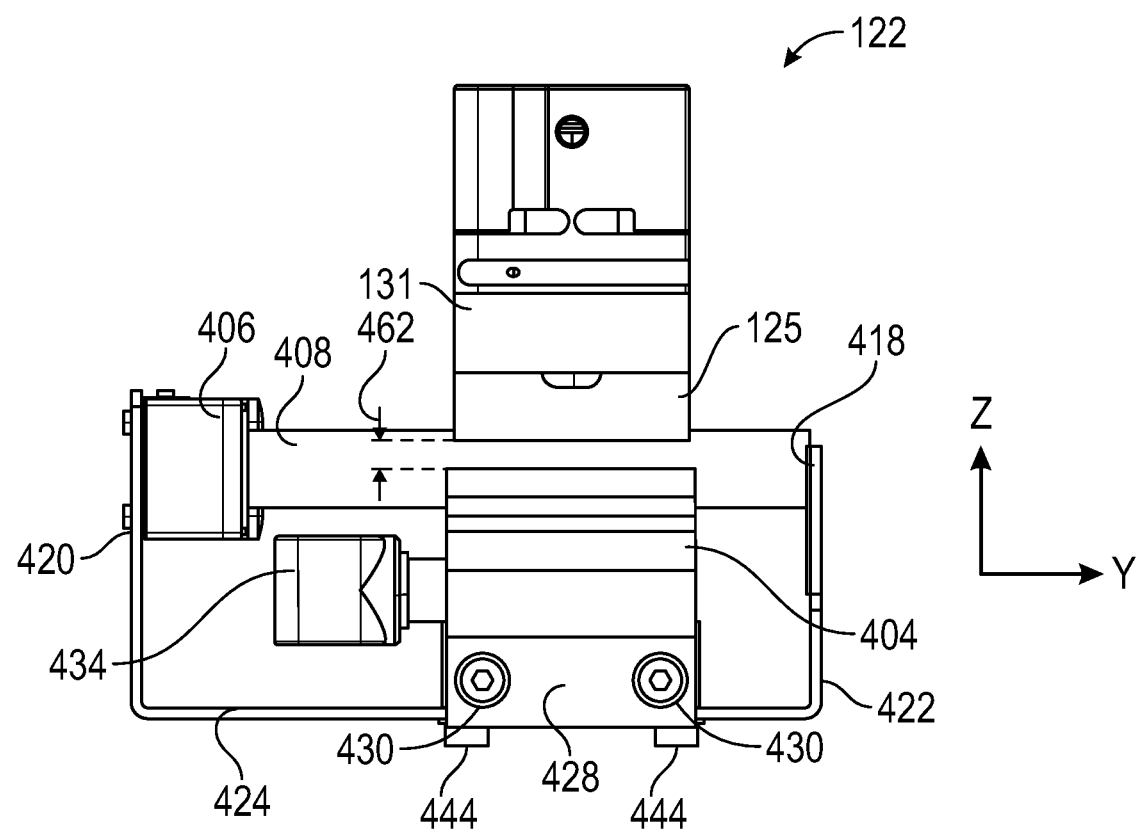
FIG. 12 shows end view of the cleaning system in another orientation, with omissions, in accordance with an example embodiment

FIG. 12 shows an end view of the cleaning system 400 with the bracket 402, guide rail 410, translating mechanism 412, and corresponding structure omitted for clarity. In FIG. 12, a distance 462 between the surface 135 of the faceplate 133 and the orifice 432 of the vacuum apparatus 404 is increased as compared a distance between the surface 135 of the faceplate 133 and the orifice 432 of the vacuum apparatus 404 shown in FIG. 11A. The distance 462 between the surface 135 of the faceplate 133 and the orifice 432 of the vacuum apparatus 404 may be adjusted in the same manner that the angle of the vacuum apparatus 404 is adjusted. That is, the securing mechanism 430 may be first loosened to allow for movement of the vacuum apparatus 404. Once the securing mechanism 430 is loosened, the vacuum apparatus 404 may moved to increase or decrease the distance 462. Once the new distance 462 has been selected, the securing mechanism 430 may be tightened until the mounting portion 428 is tightly held against the tray 412. These steps can be repeated to readjust the distance 462. The distance may be adjusted to be 0.5 mm±0.2 mm. Notably, because the orifice 432 is at a distance 462 from the faceplate 133, the vacuum apparatus 404 will not come into contact with the faceplate 133.

Cleaning Method

With the above structure described, a method of cleaning the surface 135 of the faceplate 133 with the structure will now be described. The method may begin with a calibration method 500 to calibrate the cleaning system 400 for the particular dispenser 122 being used in the overall system 100. The calibration method 500 may be considered part of the overall cleaning method in one embodiment and may be considered a separate method from the cleaning method in another embodiment. For example, the calibration method 500 does not need to be performed with every cleaning of the dispenser 122. Rather, the calibration method 500 is performed at least one time prior to the first cleaning, and then can be performed occasionally depending on certain conditions being met, which is discussed below in more detail. Thus, the overall cleaning method may or may not include the calibration method.

Figure 13:
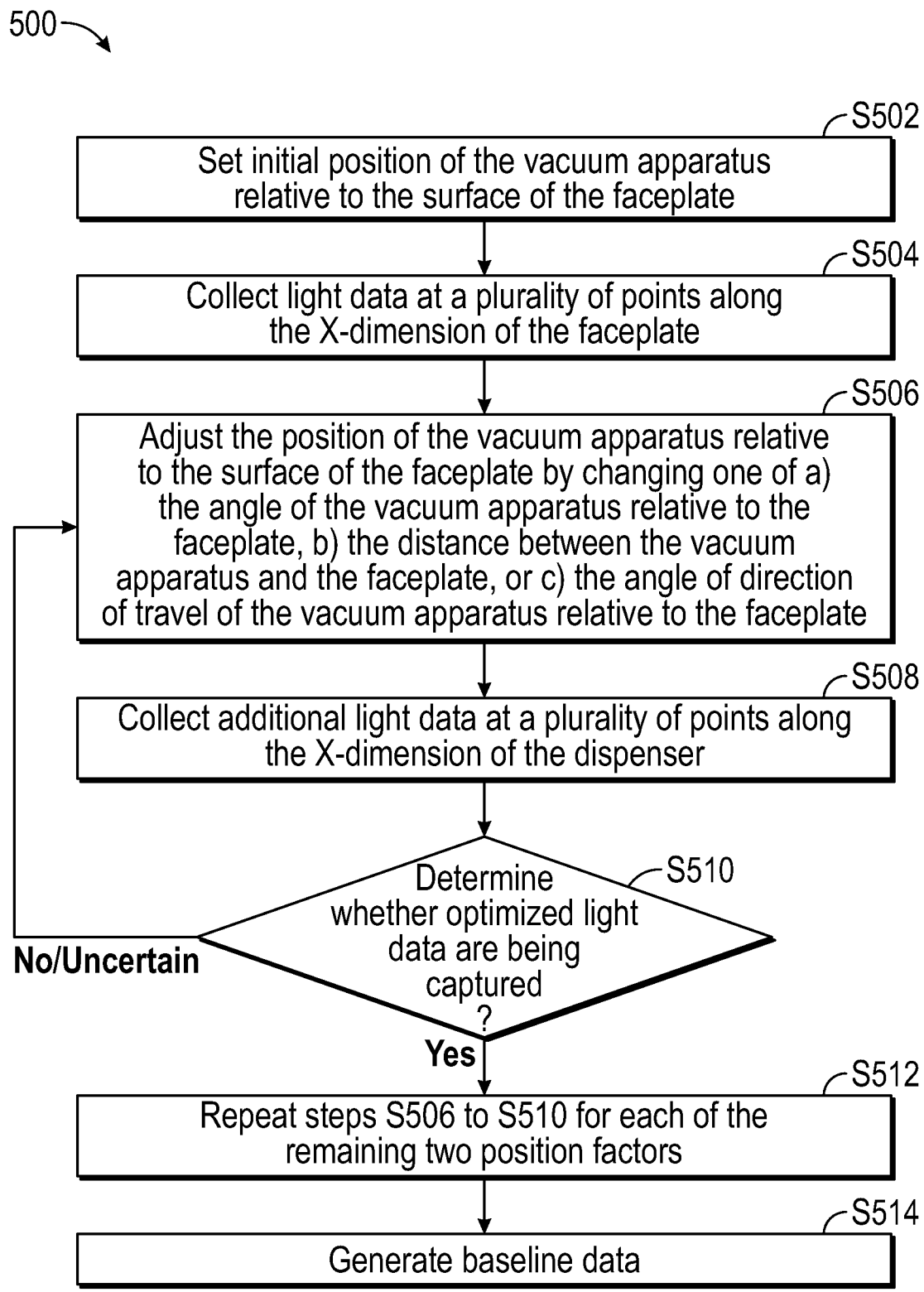
FIG. 13 shows a flowchart of a calibration method in accordance with an example embodiment.

FIG. 13 shows a flowchart of the calibration method 500. The calibration method 500 begins with step S502, where an initial position of the vacuum apparatus 404 is set relative to the surface 135 of the faceplate 133, prior to any accumulation of formable material on the faceplate 133. That is, the faceplate 133 does not have any formable material on the surface 135 at the time of performing the calibration method 500. The initial position of the vacuum apparatus 404 includes the three factors set forth above. In summary, these three factors are 1) the angle of the direction of travel 460a, 460b of the vacuum apparatus 404 relative to the horizontal plane defined by the surface 135 of the faceplate 133 (as controlled by the guide rail angle adjustment mechanism 446); 2) the angle 417a, 417b of the vacuum apparatus 404 relative to the surface 135 of the faceplate 133, and 3) the distance 462 between the surface 135 of the faceplate 133 and the vacuum orifice 432. Each of these factors can be set in the manner described above. The initial position may be arbitrarily selected or if previous data is available from other calibrations, then the initial position may be based on such data. Setting the initial position based on previous data may reduce the number of iterations required to arrive at the optimal final position as compared to arbitrarily selecting the initial position.

The method may then proceed to step S504 where light data is collected by the light emitter/sensor 406 at plurality of points along the X dimension of the faceplate 133. In step S504, the light emitter/sensor 406 travels along the length 127 of the faceplate 133 in the X dimension while emitting light across the surface 135 of the faceplate 133, and while simultaneously measuring the intensity of the light that is reflected by the retroreflector 418. The light emitter/sensor 406 may collect data starting at the first flange 129 and continue to collect data while traveling in the X dimension until reaching the second flange 131 via actuation by the translating mechanism 412. During this time, the light emitter/sensor 406 emits light and senses light at a predetermined frequency. For example, the light emitter/sensor 406 may be preset to take a light reading from 10 times per second to 30 times per second, from 15 times per second to 25 times per second, or from 18 times per second to 22 times per second. In one example embodiment, the measurement may be taken 20 times per second. The speed at which the light emitter/sensor 406 travels may be for example 0.1, 1, or 10 mm/second. In one example embodiment, the speed may be 1 mm/sec. Both the frequency of measurements and the speed of travel may be optimized to achieve sufficiently accurate data.

Figure 14:
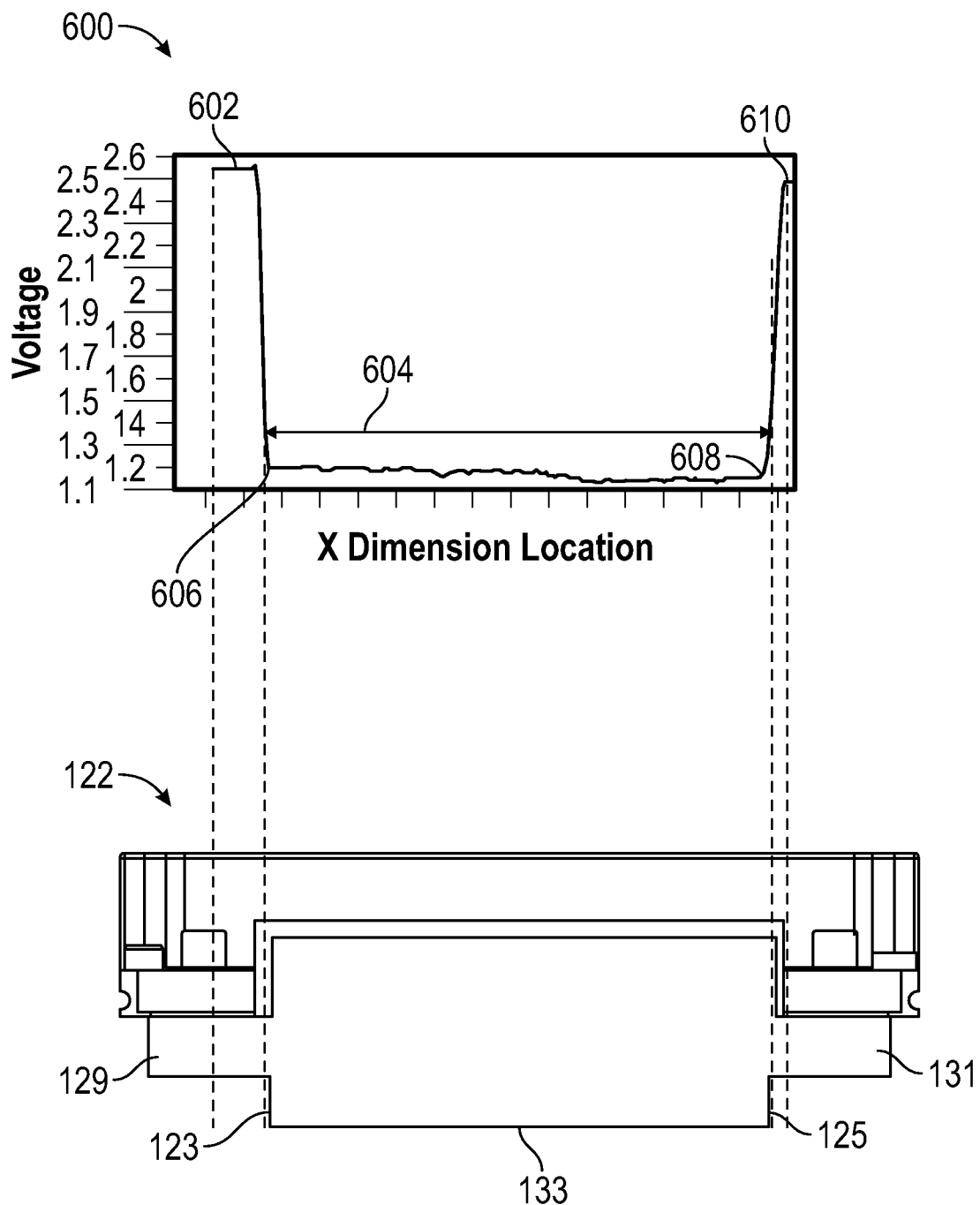
FIG. 14 shows an example data chart representing light intensity from data collected when a faceplate is free of accumulated material, and a side view of the dispenser corresponding to the data chart, in accordance with an example embodiment.

FIG. 14 shows an example chart 600 of data measurements taken by the light emitter/sensor 406 during a complete passing across the faceplate 133, with the chart 600 projected onto the dispenser 122. As shown in FIG. 14, the x-axis of the chart represents the particular location that the light emitter/sensor 406 is located in the X dimension. The far left on the x-axis corresponds to the location at the first flange 129, while the far right on the x-axis corresponds to the location at the second flange 131. The data points in between correspond to the locations along the faceplate 133 from the first end 123 to the second end 125. The particular location of the light emitter/sensor in the X dimension may be determined from the position encoder. As shown in FIG. 14, the y-axis of the chart represents the voltage measured by the light emitter/sensor 406 at the particular x-axis location. The data recorded by a light sensor is voltage but may also be a current (mA), a calibrated scaled distance (mm) (as discussed below in more detail), a percent, etc. When greater light intensity is measured, the voltage reported is greater. When less light intensity is measured, the voltage reported is lower. In the example shown in FIG. 14, a first portion of data 602 corresponds to the voltages recorded as the light emitter/sensor 406 passes across the first flange 129. The voltage is relatively much higher at this point because the beam of light mostly passes underneath the first flange 129. That is, there is less or nothing to block the light being emitted by the light emitter/sensor 406 at this location. A second portion of data 604 corresponds to the voltages recorded after the light emitter/sensor 406 has finished passing across the first flange 129 and travels all the way across the faceplate 133 until reaching the second flange 131. The leftmost end 606 of the second portion of data 604 corresponds to the location of the light emitter/sensor 406 being at the first end 123. The rightmost end 608 of the second portion of data 604 corresponds to the location of the light emitter/sensor 406 being at the second end 125. The voltage is much lower in the second portion 604 than the first portion 602 because the light is being partially blocked by the dispenser and faceplate. A third portion of data 610 corresponds to the voltages recorded as the light emitter/sensor 406 passes across the second flange 131. As with the first flange 129, the voltage is relatively much higher at this point because the beam of light mostly passes underneath the second flange 131. The variation in voltages recorded within the second portion of data 604 directly correlates to the height of the faceplate 133 in the Z dimension at each location along the X dimension because the greater the height in the Z dimension, the more light is blocked from being sensed.

The method may then proceed to step S506 where the position of the vacuum apparatus 404 is changed relative to the surface 135 of the faceplate 133 by changing one of a) the angle 417a, 417b of the vacuum apparatus 404 relative to the surface 135 of the faceplate 133, b) the distance 462 between the vacuum apparatus 404 and the faceplate 133, or c) the angle of direction of travel 460a, 460b of the vacuum apparatus 404 relative to the surface 135 of the faceplate 133. That is, in step S506 one, and only one, of the above-described factors that define the position of the vacuum apparatus 404 are changed, while the other two factors are held constant. In one example embodiment, either factor a) or factor b) is selected as the first factor to change. The magnitude of the change for the two angle factors may be in the range of ±2°. The magnitude of change for the distance 462 may be in the range of 1 mm to 2 mm.

After changing the position of one of the position factors, the method may proceed to step S508, where additional light data at a plurality of points along the X-dimension of the faceplate 133 are collected. In particular, the same data collection step noted above with respect to step S504 is repeated. That is, once again the light emitter/sensor 406 will pass across the dispenser 122 and faceplate 133 in the X dimension while measuring light intensity at the same rate as the first data collection. Thus, a new chart similar to the example shown in FIG. 14 will be generated. However, the chart will be different because of the change in the position factor. In the case of changing either a) the angle 417a, 417b of the vacuum apparatus 404 relative to the surface 135 of the faceplate 133 or b) the distance 462 between the vacuum apparatus 404 and the faceplate 133, the new chart will, as a whole move either up or down along the y-axis as compared to the original chart. In particular, the second portion 604 will be higher or lower on the y-axis. This is because when the angle or the distance is not optimized less reflected light is sensed and therefore the voltage reading is lower. However, when the angle or the distance is optimal, a maximum reflectance is achieved. Thus, one can determine if the change in the position factor was better or worse than the previous setting by seeing if the data points move upward or downward on the y-axis. If the data points move upward on the y-axis, then the new position is closer to optimal. If the data points move downward, then the new position is less optimal.

With the above principle in mind, the method may then proceed to step S510, where it is determined whether optimized light measurements are being captured. As noted above, in the case of changing either a) the angle of the vacuum apparatus relative to the surface of the faceplate or b) the distance between the vacuum apparatus and the faceplate, then this determination is made based on whether second portion 604 data has moved upward or downward on the y-axis as compared to the previous measurement. If the data has moved downward, then the answer in step S510 is certainly "no." However, even if the data has moved upward, the answer in step S510 is still "uncertain." This is because a further adjustment may move the data points upwards even further than the first adjustment. The answer in step S510 is not "yes" until the adjustment stops causing the data to move up on the y-axis and instead the data moves back down on the y-axis. In other words, the answer to step S510 can only be "yes" if a series of iterative adjustment and data collections shows the data moving downward on the y-axis immediately after an adjustment shows the data going up on the y-axis. At that point, the user knows that the setting just prior to the downward movement of data was the optimal setting. Thus, as long as the answer is "no" or "uncertain" in step S510, the steps of S506 through S510 are repeated, except that in step S506 it should be understood that the same position factor is adjusted during each iteration until reaching the optimal position or that factor. That is, the other two factors should remain unadjusted at constant positions until the factor correctly being iteratively adjusted has been optimized.

While the above steps of comparing the upward and downward movement of data with adjustment applies to a) the angle of the vacuum apparatus 404 relative to the surface 135 of the faceplate 133 and b) the distance 462 between the vacuum apparatus 404 and the faceplate 133, the same approach does not apply to when the factor being adjusted is c) the angle of direction of travel of the vacuum apparatus. In the case of adjusting c) the angle 413a, 413b of direction of travel 460a, 460b of the vacuum apparatus 404, the iterative process of comparing data is different. In this case, rather than looking at the data moving upward or downward on the y-axis, the comparison between data collections is used to determine what adjustment provides the flattest data spread in the second portion 604. For example, if the data shown in FIG. 14 is the first data collected when the angle 413a, 413b of direction of travel 460a, 460b of the vacuum apparatus 404 is at the initial position, a linear best fit line can be generated using the data points in the second portion 604. The slope of the generated line would be the initial value to be compared to subsequent iterations. After adjusting the angle 413a, 413b of direction of travel 460a, 460b of the vacuum apparatus 404, the data collection would be repeated using the light emitter/sensor 406. The new linear best fit line is generated for the second portion 604 of the new data, having a new slope. Then, the slopes can be compared. If the new slope is farther from zero (i.e., flat) than the initial slope, then the answer to step S510 is "no." If the new slope is closer to zero than the initial slope, then as above, the answer to S510 is "uncertain." As with the other two factors, this is because a further adjustment may provide a slope that is even closer to zero. The answer in step S510 is not "yes" until the adjustment stops causing the slope to get closer to zero and instead slope moves back farther from zero. In other words, as above, the answer to step S510 becomes "yes" when a series of iterative adjustment and data collections shows the slope of the linear best fit line in the second portion 604 going farther from zero immediately after an adjustment shows the slope of the linear best fit line in the second portion 604 going closer from zero. At that point, the user knows that the setting just prior to the slope moving farther from zero was the optimal setting. Thus, the same iterative process of repeating steps S504 to S510 is applicable to all three position factors.

After it is determined in step S510 that the first position factor has been optimized, the method may then proceed to step S512, where the same steps of S506 to S510 are repeated for the other two position factors. In particular, after the first factor has been optimized, it should remain fixed at the optimized position. For example, if a) the angle 417a, 417b of the vacuum apparatus 404 relative to the surface 135 of the faceplate 133 was the first position factor to be optimized, then this angle would no longer be adjusted throughout the remaining calibration process. The iterative optimization process would be performed for the one of the two remaining factors. After the second position factor is optimized, then the iterative optimization process is performed for the final remaining position factor, while keeping the first two position factors fixed at their optimized positions. Notably, the vacuum apparatus 404 is not actuated during any of the calibration steps.

In one example embodiment, the angle 417a, 417b of the vacuum apparatus 404 relative to the surface 135 of the faceplate 133 is optimized first. The adjustment may be performed by loosening the adjustment mechanism 430, repositioning the nozzle apparatus 404, then tightening the adjustment mechanism 430. The light data may then be collected as described above. After collecting the light data, the adjustment mechanism 430 may be loosened, and the angle 417a, 417b of the nozzle apparatus 404 relative to the surface 135 of the faceplate 133 may be adjusted. The light data may be collected for the new position. The repositioning and measurements may be repeated as described above until the optimum angle 417a, 417b has been achieved. Next, the distance 462 between the vacuum apparatus 404 and faceplate 133 may adjusted by loosening the adjustment mechanism 430 and repositioning the vacuum apparatus 404 to a different distance while maintaining the angle 417a, 417b. The light data may be collected in this new position. The repositioning of the distance and measurements may be repeated as described above until the optimal distance has been achieved. Finally, the angle 413a, 413b of the direction of travel 460a, 460b of the vacuum apparatus 404 may be adjusted by actuating the guide rail angle adjustment mechanism 446. The light data may be collected in this new position. The repositioning of the angle 413a, 413b of the direction of travel 460a, 460b and measurements may be repeated as described above until the optimal angle 413a, 413b of the direction of travel 460a, 460b has been achieved. As noted above, any order of optimization is suitable, but preferably the angle of direction of travel optimization is performed last to avoid accidental collision of the vacuum apparatus 404 with the faceplate 135.

After all three position factors have been optimized, the method may proceed to step S514, where baseline data is generated. The baseline data is essentially the same as FIG. 14, only that the light data is the data that is acquired after all three of the position factors have been optimized. In other words, the baseline data is a representation of the expected light measurements for a particular dispenser, with no accumulated formable material on the faceplate, after the all three of the position factors have been set to their optimal positions. The baseline data is thus information about the relative height of the surface of the faceplate at particular locations along the X dimension in terms of voltage. The baseline data also provides information about the location in the X dimension of the first end 123 and second end 125 of the faceplate 133 based on the spike in voltage readings that occur at the first portion of data 602 that corresponds to the first flange 129 and the spike in voltage that occurs at the second portion of data 610 that corresponds to the second flange 131. That is, the location along the x-axis of the baseline chart where the left data spike transitions into the second portion of data 604 indicates the first end 123 of the faceplate. Similarly, the location along the x-axis of the baseline chart where the second portion of data 604 transitions into the right data spike indicates the second end 125 of the faceplate 133. The data shown in FIG. 14 can be considered as an example of baseline data if it is assumed that FIG. 14 has been acquired after the optimization steps discussed above have been completed. After generating the baseline data in step S514, the calibration method is complete.

Figure 15A:
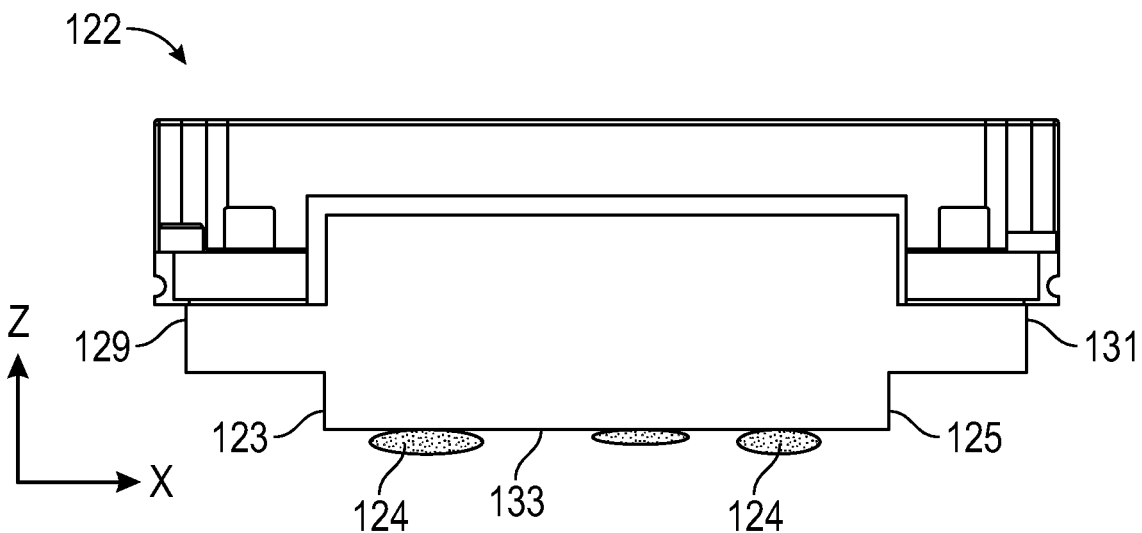
FIG. 15A shows a side view of the dispenser after formable material has accumulated on the surface of a faceplate, in accordance with an example embodiment.
Figure 15B:
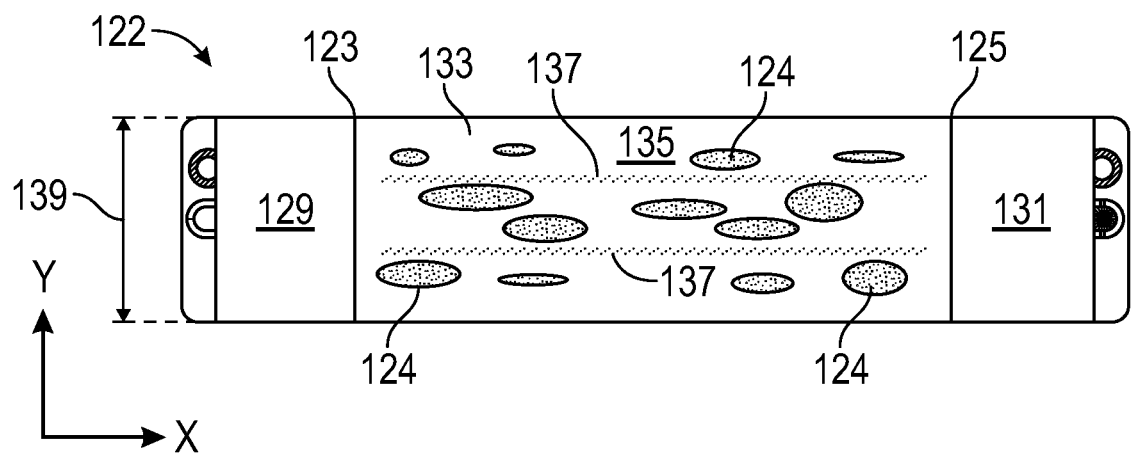
FIG. 15B shows a bottom view of the dispenser of FIG. 15A after formable material has accumulated on the surface of the faceplate, in accordance with an example embodiment.
Figure 15C:
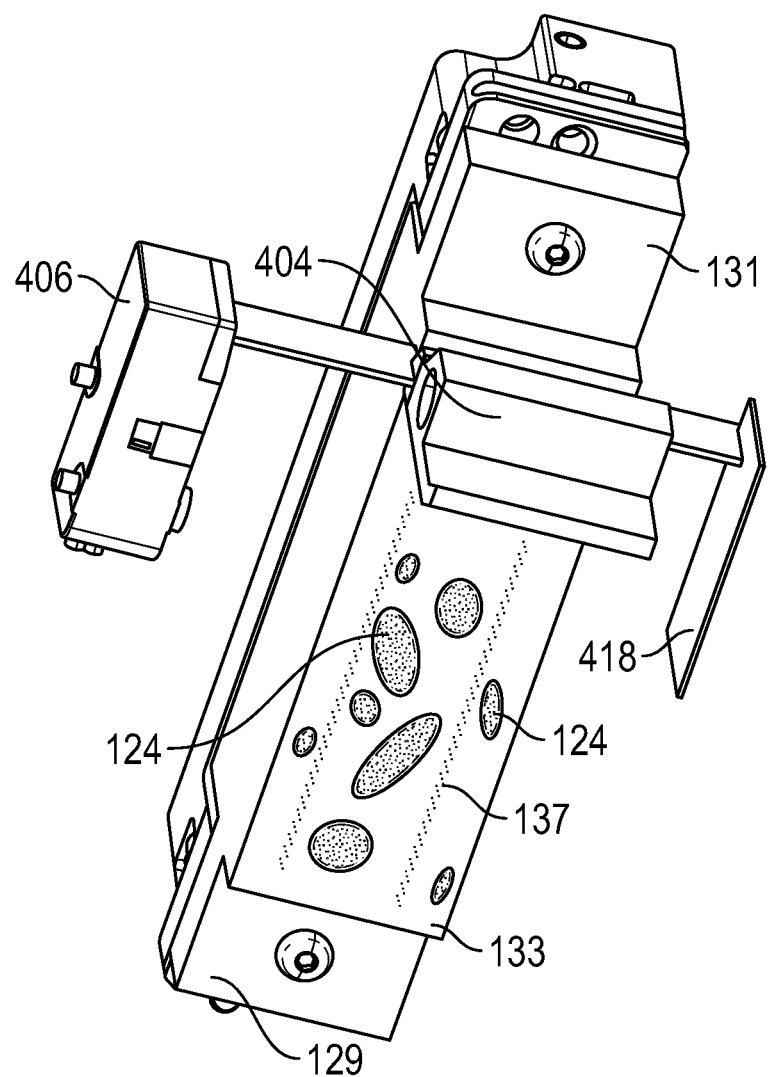
FIG. 15C shows a perspective view of the dispenser of FIG. 15A after formable material has accumulated on the surface of the faceplate, in accordance with an example embodiment.

FIGS. 15A to 15C show several views of the dispenser 122 after formable material 124 has accumulated on the surface 135 of the faceplate 133. As shown schematically in FIG. 15A to 15C the accumulated formable material 124 may be located at various patterns and thickness across the surface 135 of the faceplate 133. FIGS. 15A and 15B show the dispenser 122 with all other components of the cleaning system 400 omitted for clarity. FIG. 15C shows an underside perspective view of the dispenser 122 with accumulated formable material 124, with the vacuum apparatus 404 and the light emitter/sensor 406. The structure of the cleaning system 400 and the dispenser 122 are the same as discussed above, the only difference being that formable material 124 has accumulated on the surface 135 of the faceplate 133 after the dispenser 122 has dispensed formable material 124 many times. Thus, as discussed above, the light emitted from the light emitter/sensor 404 travels across the width 139 of the faceplate 133 and the orifice 432 of the vacuum apparatus 404 also extends across the width 139 of the faceplate 133.

Figure 16:
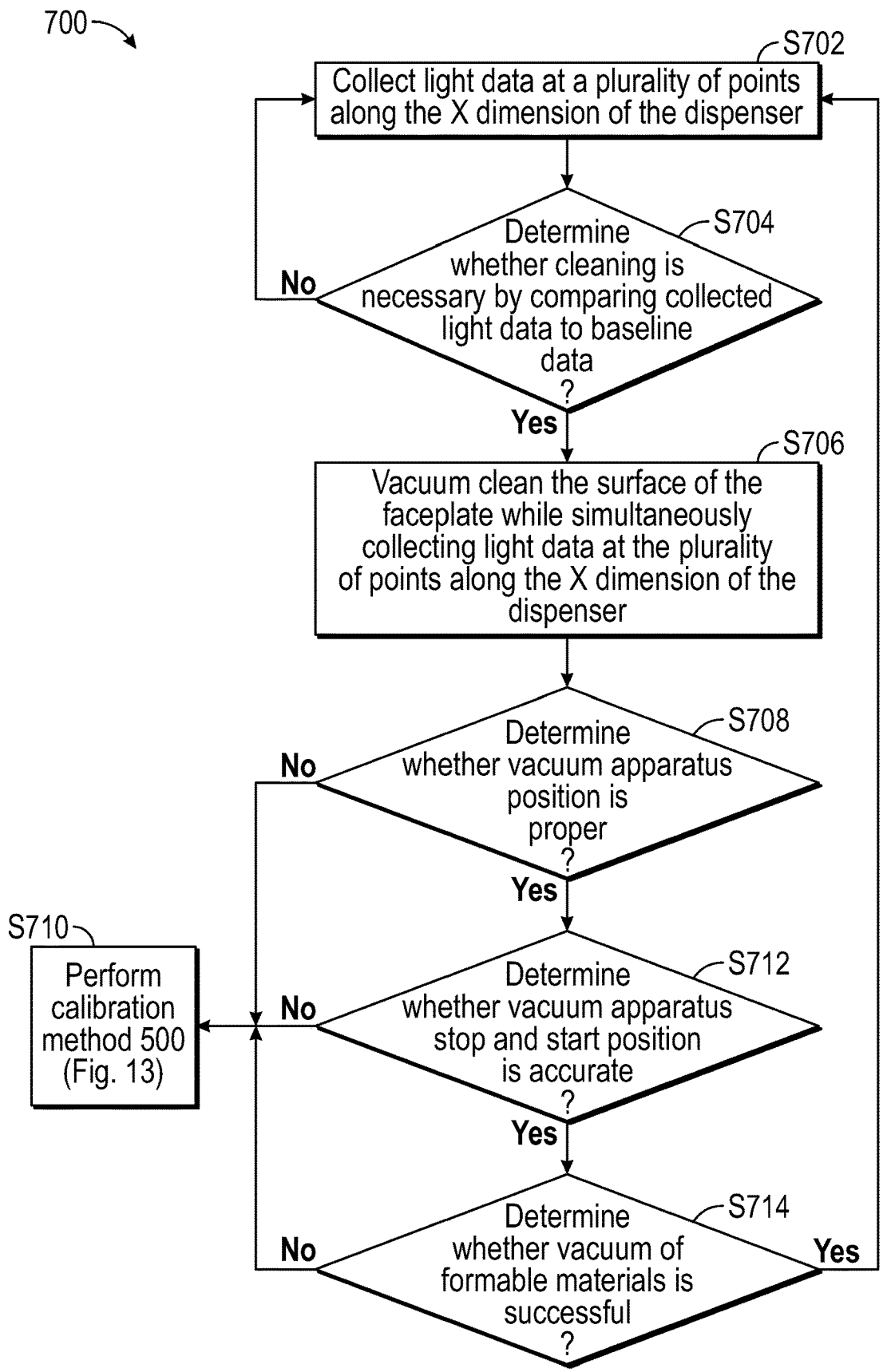
FIG. 16 shows a flowchart of a cleaning method in accordance with an example embodiment.

FIG. 16 shows a flowchart of a cleaning method 700 that may be performed after the calibration method 500 has been completed. The method begins at step S702 where light readings are collected at a plurality of points along the X dimension of the dispenser. However, as noted above, the calibration method 500 can also be considered to be part of the overall cleaning method and would occur prior to step S702 of the cleaning method 700 in such an embodiment. Step S702 is performed in the same manner as discussed above in the calibration method and the light data are generally collected at the same points along the X dimension. That is, step S702 is essentially the same as step S504 in calibration method 500. Accordingly, in step S702, the light emitter/sensor 406 travels across the length 127 of the faceplate 133 in the X dimension while emitting light across with the width 139 of the faceplate 133 in the Y dimension and sensing reflected light. The result of the data collection in step S702 generates a chart similar to the chart shown in FIG. 14, except that the voltages representing the intensities of the light received will vary more greatly depending on the amount of formable material 124 accumulated on the surface 135 of the faceplate 133.

Figure 17:
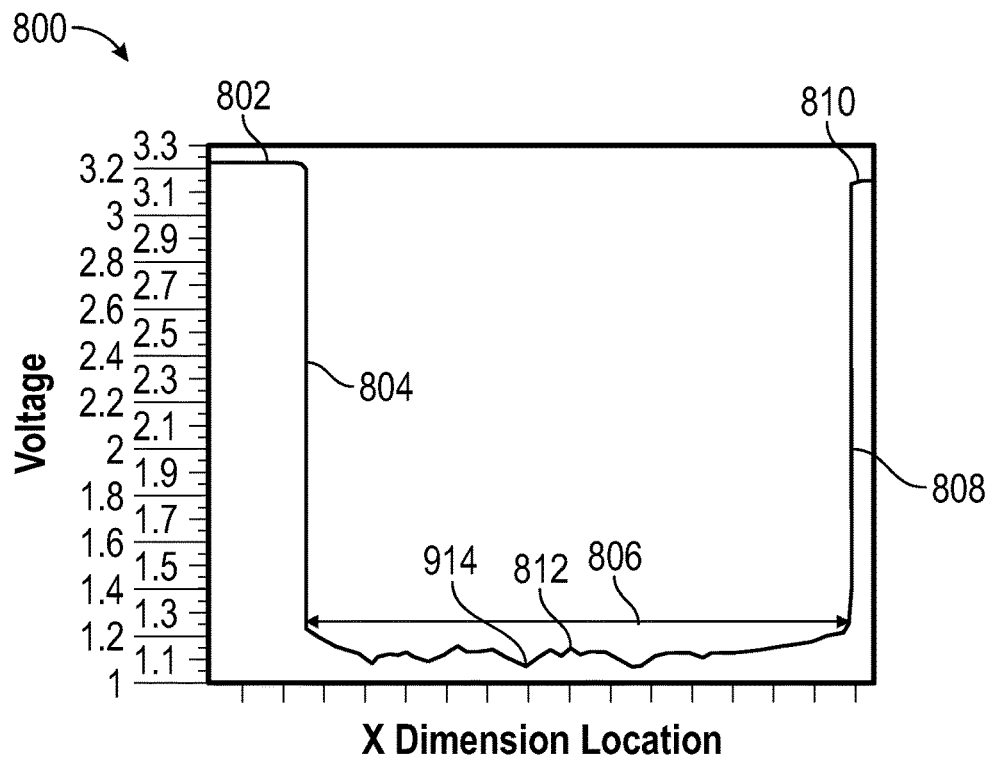
FIG. 17 shows a data chart representing light intensity from data collected when formable material has accumulated on a surface of a faceplate, in accordance with an example embodiment.

FIG. 17 shows an example of a data chart 800 of voltages representing light intensity from voltage data collected by the light emitter/sensor 406 when formable material 124 has accumulated on the surface 135 of the faceplate 133. As seen in FIG. 17, the chart includes an overall similar shape to the chart 600 in FIG. 14. The chart 800 similarly includes a first portion of data 802 on the left side before a first data spike 804, which transitions to a second portion of data 806. The second portion of data 806 leads into a second data spike 808 which transitions into a third portion of data 810. Similar to chart 600, in the chart 800 the transition from the first data spike 802 to the second portion 806 represent the light emitter/sensor 406 moving from the first flange 129 to the faceplate 133. Likewise, the transition from the second portion 806 to the second data spike 808 represents the light emitter/sensor 406 moving from the faceplate 133 to the second flange 131. As seen in FIG. 17, there are several peaks 812 and valleys 814 along the second portion of the data 806 that corresponds to locations at the surface of the faceplate. The peaks correspond to locations on the surface of the faceplate where the formable material has accumulated because the accumulated formable material blocks more of the emitted light than locations with less or no formable material. That is, chart 800 is similar to chart 600 with respect to having the same general sections of data, but is different in that there are more peaks in the second portion 806 of chart 800 than the second portion 604 of chart 600 because there no accumulated formable material in chart 600.

The method may then proceed to step S704, where it is determined whether cleaning is necessary by comparing the data collected in step S702 with the baseline data acquired in step S514. As discussed above, the baseline data acquired in step S514, shown in FIG. 14, corresponds to the height of the surface 135 of the faceplate 133 across the entire length of the faceplate relative to a base plane. On the other hand, the data collected in step S702, shown in FIG. 17, corresponds to the height when formable material has accumulated on the surface 135 of the faceplate 133. Accordingly, by comparing the data collected in step S702 with the baseline data, it can be determined whether there is too much accumulated formable material at any particular point along the X dimension. For example, for a particular point on the x-axis of FIG. 17, if the difference between the light data collected at the same point on the x-axis of FIG. 14 is greater than a predetermined threshold value, it can be concluded that too much formable material has accumulated on the faceplate. In other words, because the same x-axis location on the two charts 600, 700 correspond to the same X dimension location along the faceplate 133, if the light intensity measured at that same point is much lower than in the baseline, it is apparent that formable material has accumulated at this location. In one example embodiment if the difference in voltage between the value measured in step S702 and the value measured in the baseline data is between 50 mV and 75 mV, which is equivalent to 100 µm to 150 µm height relative to the base plane, then the determination in Step 704 is "yes." In another embodiment, a certain number of points on the x-axis may have to exceed the above value before the answer is "yes" in step S704. For example two, three, four, or more points exceeding the threshold may can be considered to be satisfactory for needing cleaning. If the above thresholds are not met, then the answer to step S704 is "no."

If the answer is "no" in step S704, then the method returns back to step S702 after a predetermined number of further dispenses by the dispenser is performed or after a predetermined amount of time has passed. The predetermined amount of dispenses or predetermined amount of time may be based on previously collected prediction data or based on how similar the data collected in step S702 is to the baseline data. For example, in one embodiment, regardless of how the data collected in step S702 compares to the baseline data, the step S702 may be repeated after every 1 to 3 million drops are dispensed, after approximately 1 µL of drops are dispensed, or after 12 to 48 hours of dispensing drops based on historical estimates of how fast formable material accumulates. In another embodiment, if it is determined that the data collected in step S702 is very close to the baseline data, then more dispenses or more time may be used before repeating step S702. On the other hand, if it is determined that the data collected in step S702 is far from the baseline data and close to exceeding the thresholds for cleaning, then less dispenses or less time may be used before repeating step S702. How close or far the data collected in step S702 is to the baseline data can be determined as an average deviation across all x-axis points, for example.

If the answer is "yes" in steps S704, i.e., it is determined that cleaning is necessary, then the method proceeds to step S706 where the vacuum apparatus 404 is used to clean the surface 135 of the faceplate 133, while simultaneously collected light data. As discussed above, the light emitter/dispenser 406 and the vacuum apparatus 404 are mounted to the tray 414 such that when the translation mechanism 412 actuates, the tray 412, the light emitter/dispenser 406, and the vacuum apparatus 404 all translate together across the surface 135 of the faceplate 133 in the X dimension. As also discussed above, light emitter/sensor 406 is positioned so that the emitted light travels across the orifice 432 of the vacuum apparatus 404, with both the orifice 432 and the emitted light 408 extending across the width 139 at the same position on the X dimension. For this reason, it is possible to both actuate the vacuum to suction formable material 124 off the surface 135 of the faceplate 133 and simultaneously measure light intensity at the same X dimension position. Accordingly, in step S706, the nozzle apparatus 404 travels along the X dimension at a distance 462 from the surface 135 of the faceplate 133 while sucking formable material 124 into the orifice 432, and at the same time the light emitter/sensor 406 is recording data at the same X dimension points as the previous data collections.

In one example embodiment, the pressure applied to the vacuum apparatus 404 may be constant from the first end 123 of the faceplate up until reaching a point along the X dimension located near the second end 125 of the faceplate. At this point, the vacuum may be greatly increased. The point along the X dimension from the first end 123 where the vacuum is increased may be from 80% the length of the faceplate to about 99% the length of the faceplate or from about 88% the length of the faceplate to about 98% the length of the faceplate. In an example embodiment, the point along the X dimension from the first end 123 where the vacuum is increased includes the region 141 (FIG. 7) of the faceplate that does not include nozzles 137. That is, as shown in FIG. 7, there is a region 141 where no nozzles are present and it is at this point where the vacuum is increased. In another example embodiment, the point along the X dimension from the first end 123 where the vacuum is increased includes a region of the faceplate in which there are some nozzles 137 present, but in such a case those nozzles are not used to dispense drops of formable material when performing step S302. In other words, in some dispensing processes, some of the nozzles near the first and/or second ends 123, 125 are not used to dispense formable material. For example, the first 1 to 10 nozzles on the first end 123 and the final 1 to 10 nozzles on the second end 125 may not be used to dispense formable material during operation. Accordingly, the increase in vacuum may occur at the position along the X dimension where the first non-used nozzle are located adjacent the second end 125. It should also be understood that in another example embodiment, the vacuum may begin suction on the second end 125 and the increase in pressure may occur near the first end 123. The increase in the vacuum pressure may be from 25% higher to 100% higher, from 33% higher to 80% higher, or from 50% to 66% higher. The increase in vacuum pressure may be then held at the increased amount until reaching the second end 125 of the faceplate 133. The benefit of increases in the vacuum pressure toward the second end 125 of the faceplate 133 is that the sudden increase assists in suctioning away formable material 124 that has been displaced during the vacuuming that has occurred up until this point in the X dimension. That is, during the period where the initial vacuum pressure is set, as the vacuum apparatus 404 travels across the faceplate 133 in the X dimension, some of the formable material 124 will be sucked up, while some will be displaced in a direction toward to the second end 125 of the faceplate 133. While some of the displaced formable material 124 may be suctioned as the vacuum apparatus 404 continues to travel in the X dimension, other amounts will continue to displace in the direction of the second end 125 of the faceplate 133. The sudden increase in vacuum pressure near the second end 125 of the faceplate 133 assists in suctioning off the final amount of displaced formable material 124.

Figure 18:
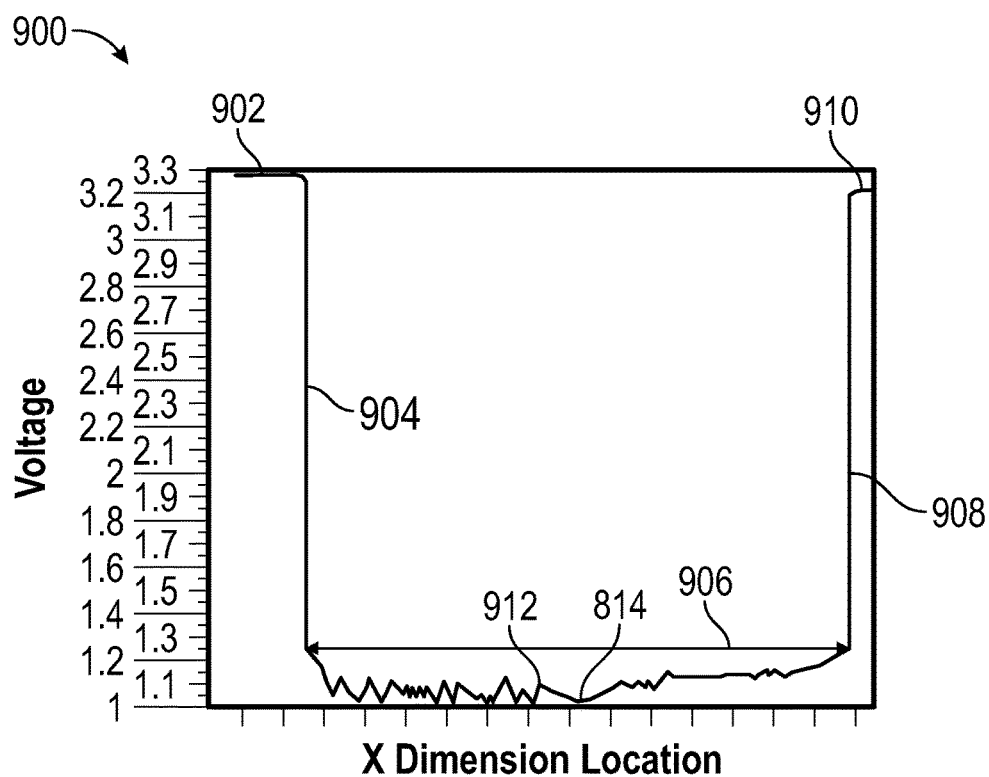
FIG. 18 shows a data chart representing light intensity from data collected while a vacuum apparatus suctions formable material from a surface of a faceplate, in accordance with an example embodiment.

FIG. 18 shows an example of a chart 900 with data representing light intensity collected by the light emitter/sensor 406 when the vacuum apparatus 404 is actuated to suction formable material 124 from the surface 135 of the faceplate 133. As seen in FIG. 18, the chart 900 includes an overall similar shape to the chart in FIGS. 14 and 17. The chart 900 similarly includes a first portion of data 902 on the left side before a data spike 904, which transitions to a second portion of data 906. The second portion of data 906 leads into another data spike 908 which transitions into a third portion of data 910. Similar to chart 600, in the chart 900 the transition from the first data spike 902 to the second portion 906 represent the light emitter/sensor 406 moving from the first flange 129 to the faceplate 133. Likewise, the transition from the second portion 906 to the second data spike 908 represents the light emitter/sensor 406 moving from the faceplate 133 to the second flange 131. As seen in FIG. 18, there are several peaks 912 and valleys 914 along the second portion of the data 806 that corresponds to locations at the surface of the faceplate. However, the peaks 912 and valleys 914 in the chart 900 have higher magnitudes than the peaks 812 and valleys 814 than in the chart 800. This is because, during the physical act of sucking formable material 124 into the orifice 432, the formable material being pulled down blocks light from being sensed by the light emitter/sensor 406. Thus, the presence of larger peaks 912 and valleys 914 in the chart 900 as compared to the chart 800, indicates that formable material 124 is being suctioned off from the surface 135 of the faceplate 133. Furthermore, the location on the x-axis of the peaks 912 and valleys 914 of chart 900 are expected to somewhat coincide with the location on the x-axis of the peaks 812 and valleys 814 of chart 800. This is because if the chart 800 indicates via a valley 814 that there is formable material present, then the corresponding valley 914 should be caused by sucking up that same formable material.

With the data obtained in step S706, the method may then proceed to step S708 where it is determined whether the vacuum apparatus 404 is in the proper position relative to the faceplate 133. It is possible that over time, the position of the vacuum apparatus 404 set during the calibration method 500 is no longer in the same position relative to the faceplate 133. That is, one, two, or all of the position factors discussed above may no longer be in the original setting due to mechanical shifting of the various components within the overall system that may cause movement of the vacuum apparatus 404 or movement of the dispenser 122 to no longer be positioned at the initially set relative position. Indeed, it is inevitable that after many operation cycles, the position of the vacuum apparatus 404 relative to the dispenser 122 will be shifted.

The data obtained during step S706 can be compared to the baseline data acquired in the calibration method 500 to determine whether such a shifting has occurred. More particularly, bridging events may be identified in which a maximum amount of light is blocked while the vacuum is on. A bridging event is when formable material 124 from the faceplate 133 bridges the gap 462 between the vacuum apparatus 404 while the vacuum is on. At least one bridging event should occur when the vacuum apparatus 404 is optimally positioned relative to the faceplate 133. If no bridging event occurs, then drifting may have occurred such that the vacuum apparatus 404 is no longer optimally positioned relative to the faceplate 133. If the bridging event lasts too long, for example for the entire period that the vacuum is over the nozzles 137 of the faceplate 133, then drifting may have occurred such that the vacuum apparatus 404 is no longer optimally positioned relative to the faceplate 133.

The determination in step S708 can also be based on comparing the data collected after the cleaning operation has been completed with the baseline data. This same comparison is discussed below with respect to FIG. 19. Thus, step S708 may also include an additional step of acquiring light data after the vacuum has been completed to generate the data shown in FIG. 19 and comparing that data to the baseline data in the manner described below. This comparison can be used in addition to the comparison of the data acquired during the vacuuming with the baseline data. If one or both of these instances are occurring, it is an indication that drifting may have occurred. In other words, data showing that the faceplate has not been adequately cleaned is also useful information in determining whether the position of the vacuum apparatus relative to the faceplate is no longer optimal.

If it is determined in step S708 that the vacuum apparatus 404 is no longer in the proper position relative to the faceplate 133, i.e., the answer is "no", then the method proceeds to step S710. In step S710, the calibration method 500 is performed again to optimize the position of the vacuum apparatus 404 relative to the faceplate 133. Prior to performing the calibration method 500, the surface 135 of the faceplate 133 should be completely cleaned for the calibration method to be accurate. Thus, prior to performing the calibration method 500, a separate cleaning step may be performed such as manually wiping the surface 135 of the faceplate 133.

If it is determined in step S708 that the position of the vacuum apparatus 404 relative to the dispenser 122 is still proper, then the method proceeds to step S712, where it is determined whether the end points 123, 125 of the faceplate are being detected at the proper location. Step S712 can be performed by comparing the data obtained in step S706 to the baseline data acquired in the calibration method 500 to determine whether the endpoints 123, 125 of the faceplate are being detected at the proper location. More particularly, as discussed above, the data acquired during the calibration method 500 shows the position of the endpoints 123, 125 of the faceplate in the X dimension because there is a sudden spike in the sensed light when the light emitter/sensor 406 reaches the first flange 129 and the second flange 131 on either end of the faceplate 133. The point along the X dimension that these spikes occur in the baseline data indicates where the location of the endpoints 123, 125 of the faceplate are expected to be located. As discussed above, the data acquired in step S708, shown in FIG. 18, also includes data spikes 904, 908 representing the location of the endpoints 123, 125 of the faceplate 133. If the location of the data spikes 904, 908 of FIG. 18 do not match the same x-axis position of the data spikes 804, 808 of FIG. 17, then the end points 123, 125 of the faceplate 133 are not being detected at the correct location. The endpoints 123, 125 may be considered not matching if there is a deviation of greater than a threshold such as: 0.1 mm; 1 mm; 5 mm; or 10 mm or a deviation on the order of 1-6% of the length 127 of the faceplate 133. If the endpoints 123, 125 are of the faceplate 133 according the data collected in step S706 are not where they are expected to be, then this means that vacuum pressure is not being applied at the proper location along the X dimension. This is particularly important for the sudden increase in vacuum pressure, which, as discussed above, is controlled to occur at a particular location along the X dimension of the faceplate 133. In other words, if the endpoints 123, 125 of the faceplate are not being detected in the expected location along the X dimension, then the vacuum pressure increase is going to be applied too early or too late. Similarly, the vacuum pressure may turn on or stop too early or too late. Thus, when the answer to step S712 is "no," then the method also proceeds to step S170 where the calibration method 500 is performed again. As above, prior to performing the calibration method 500, the faceplate 133 will need to be completely removed of formable material 124, such as by manual cleaning.

If it is determined in step S712 that the answer is "yes," i.e., that the endpoints 123, 125 of the faceplate 133 are being detected in the proper position, then the method proceeds to step S714 where it is determined whether the vacuuming of the formable material 124 has been successful. Step S714 can be performed by observing the data for periodic data peaks that are higher than the peaks shown in the data collected in step S702. When the vacuuming of the formable material 124 is successfully occurring, there is an expectation that there would be sharp peaks of higher magnitude than the peaks in the data collected in step S702. That is, the bridging event described above also informs whether the vacuuming of the formable material has been successful. When formable material is successfully being pulled off the faceplate, more light is blocked. The data acquired in step S706 (FIG. 18) can be compared to the data collected in step S702 (FIG. 17) in this step. If the data in FIG. 18 does not show any bridging events or the data in FIG. 18 indicates there are no breaks in the fluid being pulled off the surface of the faceplate, but it is also known that the faceplate does have formable material on the surface from the data in FIG. 17, then it means the vacuum is not working and/or the cleaning is malfunctioning and damaging the faceplate.

While FIG. 16 shows the order of steps to be first step S708, followed by step S712, and lastly step S714, it should be understood that these steps can be performed in any order. In any case, if the answer is "no" to any one of these steps, the method proceeds to step S710. When the answer is "yes" to all three steps the method proceeds to back to step S702. In the case that the calibration step S710 is indeed performed, after completing the calibration, the method 700 would then be performed from the beginning after the same amount of time and/or number of dispenses as described above has passed.

Figure 19:
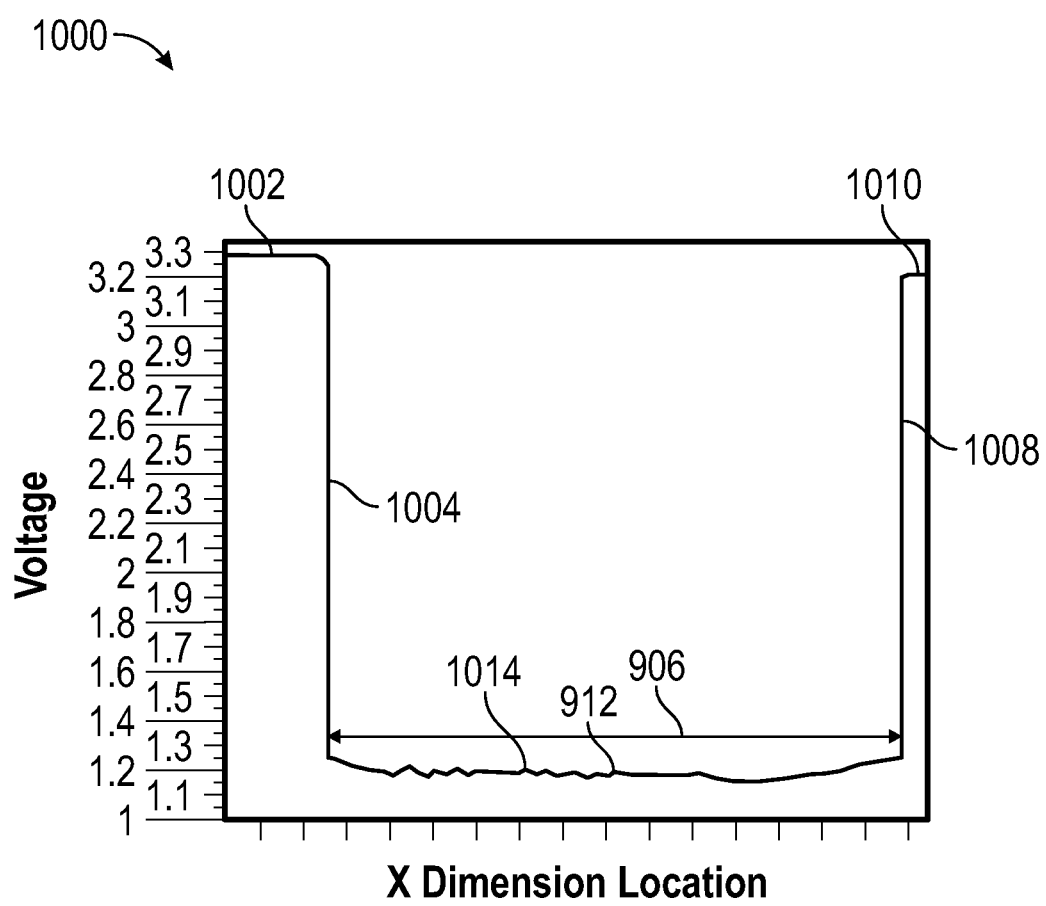
FIG. 19 shows a data chart representing light intensity from data collected after formable material has been removed from a surface of a faceplate, in accordance with an example embodiment.

Returning to step S702, a plurality of light data are collected at the same plurality of points as in the previous steps along the X dimension of the faceplate 133. FIG. 19 shows an example of a chart 1000 representing light intensity data collected at step S702 by the light emitter/sensor 406 after the completion of step S714. As seen in FIG. 19, the chart 1000 includes an overall similar shape to the chart in FIGS. 14, 17, and 18. The chart 1000 similarly includes a first portion of data 1002 on the left side before a data spike 1004, which transitions to a second portion of data 1006. The second portion of data 1006 leads into another data spike 1008 which transitions into a third portion of data 1010. Similar to chart 600, in the chart 1000 the transition from the first data spike 1002 to the second portion 1006 represent the light emitter/sensor 406 moving from the first flange 129 to the faceplate 133. Likewise, the transition from the second portion 1006 to the second data spike 1008 represents the light emitter/sensor 406 moving from the faceplate 133 to the second flange 131. As seen in FIG. 14, there are several peaks 1012 and valleys 1014 along the second portion of the data 1006 that corresponds to locations at the surface 135 of the faceplate 133. Because the data in chart 1000 is acquired after the vacuum suction step S706 has occurred, the chart 1000 can be compared to the chart 600 to see how well the surface 135 of the faceplate 133 has been cleaned using the vacuum apparatus 404. That is, if all of the formable material 124 has been suctioned off of the surface 135 of the faceplate 133, the chart 1000 should be nearly identical to the chart 600. This is because, as discussed above, the data of chart 600 is collected using a faceplate 133 with no formable material 124 present on the surface 135. Thus, the chart 600 and the chart 1000 can be compared in step S704. That is, the method 700 may then repeat all of steps S704 through S714.

If the data collected in FIG. 19 does not closely match the baseline data, then it can be determined that the cleaning was not successful. Specifically, if the chart in FIG. 19 has been shifted upwardly or downwardly too greatly in the y-axis relative to the baseline data (FIG. 14), or if the slope of the best fit linear line fitted to the FIG. 19 data is much larger than the slope of the best fit linear line fitted to the FIG. 14 data, then the cleaning was not successful. Anything less than 25 mV shift in the y-axis, which corresponds to less than 50 μm, may be considered an acceptable deviation. With respect to the slope of the best fit linear line, a difference in slope of less than 10 my/9 mm (corresponding to 200 μm/9 mm slope) may be considered an acceptable deviation. Another option is to subtract the baseline data from the data collected after cleaning and fitting a best fit linear line to the subtracted data. If the slope of the subtracted data is less than 10 my/9 mm (corresponding to 200 μm/9 mm slope), than it may be considered an acceptable deviation. Outside of any of these ranges, the cleaning process may be considered to have been unsuccessful. As noted above, this comparison can also be used to determine whether the vacuum apparatus is no longer positioned properly relative to the faceplate.

As discussed above, the data acquired by the light emitter/sensor 406 is in units of voltage. However, it is also possible to correlate the voltage reported by the light emitter/sensor 404 with heights relative a surface plane. This can be done by first obtaining a dummy head having the same dimension of the dispenser, the dummy head having a flat surface corresponding to the surface of the faceplate in the actual dispenser head. A plurality of shims, each having a known thickness can be placed spaced part on the flat surface of the dummy head. For example, five shims can be placed on the flat surface of the dummy head in a row along the X dimension, where the first shim has a thickness of 500 microns, the second shim has a thickness of 300 microns, the third shim has a thickness of 200 microns, the fourth shim has a thickness of 100 microns, and the fifth shim has a thickness of 50 microns. Each shim may be generally rectangular in shape with the short side extending in the X dimension and the long side extending in the Y dimension. The short side may be about ⅙ the length 127 of the faceplate and the long side may be about ¾ the width 139 of the faceplate. The shims may be centered with respect to the Y dimension and spaced apart in the X dimension, with the same interval of space being present between adjacent shim in the X dimension. The reference plane would be the flat surface of the dummy head, on which the shims are placed. The same light data collection process described above can be performed where the dispenser is replaced with the dummy head having the shims. The light emitter/sensor 406 will record voltage data points as it passes along the short side of each shim. The known height on one axis can be plotted against the corresponding voltages on the other axis. Then, a linear best-fit line can be fitted to the data points. This resulting linear equation creates a function where height is a function of voltage. That is, the voltage reported by the light emitter/sensor 406 can be entered into the equation and the outputted value would be the corresponding height. In this manner, the voltage reported by the light emitter/sensor 406 can be correlated to height relative to the reference plane.

To determine the specific height of accumulated formable material, the heights correlating to the baseline data acquired at step S514 (i.e., chart 600) can be subtracted from the heights correlating to the data acquired during step S702 (i.e., chart 800). The result of the subtraction would be the height of the accumulated formable material on the surface of the faceplate prior to applying the vacuum cleaning. The height data can also be approximately correlated to amount of formable material on the faceplate based upon material properties of the faceplate; and material properties of the formable material including surface tension of the formable material on the faceplate. By the same procedure, the height of the formable material on the faceplate after the vacuum cleaning step S506 (i.e., chart 1000) can be determined. This too, can be correlated to amount of formable material. Therefore, another manner of determining whether the vacuum cleaning is successful is to subtract the amount of formable material calculated from the post vacuum clean data (i.e., chart 10000) from the pre-clean data (i.e., chart 800). This subtraction would represent how much formable material was suctioned off of the faceplate. If it is determined that not enough formable material has been removed, then a change in vacuum pressure can be implemented, for example, in a future vacuum cleaning. The determination may be made by comparing the subtracted data to data sets that are known to represent successful cleaning.

As described above, the nanoimprint lithography system 100 may be regulated, controlled, and/or directed by the one or more processors 140 (controller). This includes all of the method steps described above, including controlling the hardware that changes all three position factors that impact the position of the vacuum apparatus 404 relative to the faceplate 135, controlling the translation mechanism 412 to control the movement of the vacuum apparatus 404 and light emitter/sensor 406, controlling when the vacuum pressure is applied and at what pressure, controlling the light emitter/sensor 406 to collect light data, and performing the determining steps by analyzing the acquired voltage data and making the necessary calculations. While not shown in the figures, it should be understood that any of the mechanical adjustments (i.e., adjusting the angle of guide rail to impact angle of approach, the angle of the vacuum apparatus relative to the faceplate, and the distance between the vacuum apparatus and the faceplate) can be controlled by the controller via a motor or other known automation means.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of cleaning a dispenser including a faceplate, the faceplate having a first end, a second end, a surface, a length extending in an X dimension from the first end to the second end, and a width extending in a Y dimension, the method comprising:
    translating a light emitter along the X dimension across the length of the faceplate;
    emitting light from the light emitter over the surface of the faceplate along the Y dimension during the translating of the light emitter;
    measuring an intensity of the light at a plurality of points on the surface of the faceplate along the X dimension after the light has passed over the surface of the faceplate along the Y dimension;
    determining, based on the measured light intensity, whether an amount of accumulated formable material of at least one point of the plurality of points is greater than a predetermined value; and
    in a case that the amount of accumulated formable material at the at least one point of the plurality of points is determined to be greater than a predetermined value:
        translating a vacuum apparatus across the faceplate along the X dimension, the vacuum apparatus being located a distance from the surface of the faceplate; and
        imparting a suction force on the surface of the faceplate using the vacuum apparatus during the translating of the vacuum apparatus to remove at least a portion of the accumulated formable material from the surface of the faceplate.

2. The method of claim 1, further comprising:
    an additional translating of the light emitter along the X dimension across the length of the faceplate during the translation of the vacuum apparatus;
    an additional emitting of light from the light emitter over the surface of the faceplate along the Y dimension during the additional translating of the light emitter;
    an additional measuring of an intensity of the light at another plurality of points on the surface of the faceplate along the X dimension after the light has passed over the faceplate along the Y dimension during the additional emitting;
    determining whether to adjust a position of vacuum apparatus relative to the surface of the faceplate based on the additional measured light intensity; and
    in a case that it is determined to adjust the position of the vacuum apparatus, adjusting the position of the vacuum apparatus relative to the faceplate.

3. The method of claim 2, wherein adjusting the position of the vacuum apparatus relative to the faceplate comprises performing a calibration method to optimize the position of the vacuum apparatus relative to the surface of the faceplate.

4. The method of claim 2, further comprising:
    generating a set of baseline data representing measured light intensity at the plurality of points in the X dimension of the faceplate when the faceplate is free of accumulated formable material,
    wherein the determining of whether to adjust the position of the vacuum apparatus relative to the surface of the faceplate is further based on a comparison between the additional measured light intensity and the baseline data.

5. The method of claim 4, further comprising:
    determining an actual location in the X dimension of the first end of the faceplate and the second end of the faceplate based on the baseline data; and
    determining a measured location in the X dimension of the first end of the faceplate and the second end of the faceplate based on the additional measured light intensity,
    wherein the determining of whether to adjust the position of the vacuum apparatus relative to the surface of the faceplate is further based on a comparison between the actual location of the first end of the faceplate and the second end of the faceplate with the measured location of the first end of the faceplate and the second end of the faceplate.

6. The method of claim 1, further comprising:
    prior to translating the light emitter along the X dimension across the length of the faceplate, performing a calibration method to optimize a position of the vacuum apparatus relative to the surface of the faceplate.

7. The method of claim 6, wherein the performing of the calibration method comprises:
- optimizing an angle of the vacuum apparatus relative to the surface of the faceplate;
- optimizing a distance between the vacuum apparatus and the surface of the faceplate; and
- optimizing an angle of a direction of travel of the vacuum apparatus relative to the surface of the faceplate.

8. The method of claim 7, wherein optimizing the angle of the vacuum apparatus relative to the surface of the faceplate, comprises:
  (a) setting an initial selection for each of the angle of the vacuum apparatus relative to the surface of the faceplate, the distance between the vacuum apparatus and the surface of the faceplate, and the angle of the direction of travel of the vacuum apparatus relative to the surface of the faceplate;
  (b) additional translating of the light emitter along the X dimension across the length of the faceplate;
  (c) additional emitting of the light from the light emitter over the surface of the faceplate along the Y dimension during the further translating of the light emitter;
  (d) additional measuring an intensity of the light at the plurality of points on the surface of the faceplate along the X dimension after the light has passed over the surface of the faceplate along the Y dimension;
  (e) adjusting the position of the angle of the vacuum apparatus relative to the surface of the faceplate while maintaining the initially selected distance between the vacuum apparatus and the surface of the faceplate, and while maintaining the initially selected angle of the direction of travel of the vacuum apparatus relative to the surface of the faceplate; and
  (f) repeating steps (b) to (e) until the measured light intensity indicates that an optimal selection of the angle of the vacuum apparatus relative to the surface of the faceplate has been achieved.

9. The method of claim 7, wherein optimizing the distance between the vacuum apparatus and the surface of the faceplate, comprises:
  (a) setting an initial selection for each of the angle of the vacuum apparatus relative to the surface of the faceplate, the distance between the vacuum apparatus and the surface of the faceplate, and the angle of the direction of travel of the vacuum apparatus relative to the surface of the faceplate;
  (b) additional translating of the light emitter along the X dimension across the length of the faceplate;
  (c) additional emitting of the light from the light emitter over the surface of the faceplate along the Y dimension during the further translating of the light emitter;
  (d) additional measuring an intensity of the light at the plurality of points on the surface of the faceplate along the X dimension after the light has passed over the surface of the faceplate along the Y dimension;
  (e) adjusting the selection of the distance between the vacuum apparatus and the surface of the faceplate while maintaining the initially selected angle of the vacuum apparatus relative to the surface of the faceplate, and while maintaining the initially selected angle of the direction of travel of the vacuum apparatus relative to the surface of the faceplate; and
  (f) repeating steps (b) to (e) until the measured light intensity indicates that an optimal selection of the distance between the vacuum apparatus and the surface of the faceplate has been achieved.

10. The method of claim 7, wherein optimizing the angle of the direction of travel of the vacuum apparatus relative to the surface of the faceplate, comprises:
  (a) setting an initial selection for each of the angle of the vacuum apparatus relative to the surface of the faceplate, the distance between the vacuum apparatus and the surface of the faceplate, and the angle of the direction of travel of the vacuum apparatus relative to the surface of the faceplate;
  (b) additional translating of the light emitter along the X dimension across the length of the faceplate;
  (c) additional emitting of the light from the light emitter over the surface of the faceplate along the Y dimension during the further translating of the light emitter;
  (d) additional measuring an intensity of the light at the plurality of points on the surface of the faceplate along the X dimension after the light has passed over the surface of the faceplate along the Y dimension;
  (e) adjusting the position of the angle of the direction of travel of the vacuum apparatus relative to the surface of the faceplate while maintaining the initially selected distance between the vacuum apparatus and the surface of the faceplate, and while maintaining the initially selected angle of the vacuum apparatus relative to the surface of the faceplate; and
  (f) repeating steps (b) to (e) until the measured light intensity indicates that an optimal selection of the angle of the direction of travel of the vacuum apparatus relative to the surface of the faceplate has been achieved.

11. The method of claim 7, wherein the calibration method is performed either prior to accumulating any formable material on the surface of the faceplate or after removing any accumulated formable material on the surface of the template.

12. The method of claim 11, wherein the performing of the calibration method further comprises:
- after optimizing the angle of the vacuum apparatus relative to the surface of the faceplate, after optimizing the distance between the vacuum apparatus and the surface of the faceplate, and after optimizing the angle of the direction of travel of the vacuum apparatus relative to the surface of the faceplate:
- generating a set of baseline data representing measured light intensity at the plurality of points in the X dimension of the faceplate when the faceplate is free of accumulated formable material.

13. The method of claim 1, wherein the vacuum apparatus comprises an orifice facing the surface of the faceplate.

14. The method of claim 13, wherein the orifice extends in the Y dimension across the surface of the faceplate.

15. The method of claim 13, wherein the light emitter is configured to direct the emitted light across the orifice.

16. The method of claim 1, further comprising increasing the suction force when the vacuum apparatus reaches a predetermined position in the X dimension.

17. The method of claim 16, further comprising maintaining the increased suction force until the vacuum apparatus reaches the second end of the faceplate.

18. The method of claim 1, further comprising:
- generating a set of baseline data representing measured light intensity at the plurality of points in the X dimension of the faceplate when the faceplate is free of accumulated formable material;
- after imparting the suction force on the surface of the faceplate:

additional translating of the light emitter along the X dimension across the length of the faceplate;

additional emitting of light from the light emitter over the surface of the faceplate along the Y dimension during the second translating of the light emitter;

additional measuring of an intensity of the light at an additional plurality of points on the surface of the faceplate along the X dimension after the light has passed over the faceplate along the Y dimension during the additional emitting; and determining whether the at least a portion of the accumulated formable material was removed from the faceplate based on a comparison of the additional measured light intensity and the baseline data.

19. A dispensing system, comprising:

a dispenser including a faceplate, the faceplate having:
  a first end;
  a second end;
  a surface;
  a length extending in an X dimension from the first end to the second end; and
  a width extending in a Y dimension;
a vacuum apparatus facing the faceplate and located a distance from the faceplate;
a light emitter;
a light receiver;
a translating mechanism;
one or more processors; and
one or more memories storing instructions, when executed by the one or more processors, causes the dispensing system to:
  actuate the translating mechanism to translate the light emitter along the X dimension across the length of the faceplate;
  actuate the light emitter to emit light over the surface of the faceplate along the Y dimension during the translating of the light emitter;
  actuate the light receiver to measure an intensity of the light at a plurality of points on the surface of the faceplate along the X dimension after the light has passed over the surface of the faceplate along the Y dimension;
  determine, based on the measured light intensity, whether an amount of accumulated formable material of at least one point of the plurality of points is greater than a predetermined value; and
  in a case that the amount of accumulated formable material at the at least one point of the plurality of points is determined to be greater than a predetermined value:
    actuate the translating mechanism to translate the vacuum apparatus across the faceplate along the X dimension; and
    impart a suction force on the surface of the faceplate using the vacuum apparatus during the translating of the vacuum apparatus to remove at least a portion of the accumulated formable material from the surface of the faceplate.

20. A method of making an article, comprising:

cleaning a dispenser including a faceplate, the faceplate having a first end, a second end, a surface, a length extending in an X dimension from the first end to the second end, and a width extending in a Y dimension, the cleaning including:
  translating a light emitter along the X dimension across the length of the faceplate;
  emitting light from the light emitter over the surface of the faceplate along the Y dimension during the translating of the light emitter;
  measuring an intensity of the light at a plurality of points on the surface of the faceplate along the X dimension after the light has passed over the surface of the faceplate along the Y dimension;
  determining, based on the measured light intensity, whether an amount of accumulated formable material of at least one point of the plurality of points is greater than a predetermined value; and
  in a case that the amount of accumulated formable material at the at least one point of the plurality of points is determined to be greater than a predetermined value:
    translating a vacuum apparatus across the faceplate along the X dimension, the vacuum apparatus being located a distance from the surface of the faceplate; and
    imparting a suction force on the surface of the faceplate using the vacuum apparatus during the translating of the vacuum apparatus to remove at least a portion of the accumulated formable material from the surface of the faceplate;
dispensing a portion of the formable material onto a substrate using the dispenser;
forming a pattern or a layer of the dispensed formable material on the substrate; and
processing the formed pattern or layer to make the article.

* * * * *